United States Patent
Donnelly

(10) Patent No.: US 10,950,489 B2
(45) Date of Patent: Mar. 16, 2021

(54) DEVICES AND METHODS FOR RADIATION HARDENING INTEGRATED CIRCUITS USING SHALLOW TRENCH ISOLATION

(71) Applicant: TallannQuest LLC, Plano, TX (US)

(72) Inventor: Emily Ann Donnelly, Whitesboro, TX (US)

(73) Assignee: TallannQuest LLC, Plano, TX (US)

( * ) Notice: Subject to any disclaimer, the term of this patent is extended or adjusted under 35 U.S.C. 154(b) by 0 days.

(21) Appl. No.: 16/937,881

(22) Filed: Jul. 24, 2020

(65) Prior Publication Data

US 2020/0357681 A1 Nov. 12, 2020

Related U.S. Application Data

(62) Division of application No. 16/231,552, filed on Dec. 23, 2018, now Pat. No. 10,770,342.

(60) Provisional application No. 62/731,894, filed on Sep. 15, 2018.

(51) Int. Cl.
*H01L 21/762* (2006.01)
*H01L 29/06* (2006.01)
*H01L 27/092* (2006.01)
*H01L 21/763* (2006.01)

(52) U.S. Cl.
CPC ...... *H01L 21/76224* (2013.01); *H01L 21/763* (2013.01); *H01L 21/76202* (2013.01); *H01L 27/092* (2013.01); *H01L 29/0642* (2013.01)

(58) Field of Classification Search
CPC ..................................................... H01L 21/762
See application file for complete search history.

(56) References Cited

U.S. PATENT DOCUMENTS

| | | | | |
|---|---|---|---|---|
| 5,220,192 | A * | 6/1993 | Owens | H01L 21/76218 257/519 |
| 6,054,367 | A * | 4/2000 | Groves | H01L 21/762 257/E21.545 |
| 7,906,805 | B2 * | 3/2011 | Sadd | H01L 27/11521 257/316 |
| 2011/0084324 | A1 * | 4/2011 | Donnelly | H01L 21/823878 257/296 |

* cited by examiner

*Primary Examiner* — Marvin Payen
(74) *Attorney, Agent, or Firm* — Gregory A. Magel

(57) ABSTRACT

Designs for radiation hardening CMOS devices and integrated circuits using shallow trench isolation (STI) improve total ionizing dose (TID) radiation response by reducing the leakage currents from source to drain associated with corners and sidewalls of trench insulator edges passing under the gate in an NMOS device while maintaining high breakdown voltage. A silicide block pattern is used in combination with pullback of N+ source and drain regions from at least a portion of these edges of the active region. Additional p-type implants along these edges further increase parasitic threshold voltages and enhance radiation hardness. A process for fabricating devices and integrated circuits incorporating these features is also provided. These techniques and processes are applied to exemplary low-voltage NMOS transistors having straight gates and to high-voltage annular-gate devices, as well as to device-to-device isolation in integrated circuits.

3 Claims, 16 Drawing Sheets

DEVICES AND METHODS FOR RADIATION HARDENING INTEGRATED CIRCUITS USING SHALLOW TRENCH ISOLATION

This application is a divisional of application Ser. No. 16/231,552, filed Dec. 23, 2018, which claims the benefit of U.S. Provisional Application No. 62/731,894, filed Sep. 15, 2018.

This invention was made with government support under Award Number 1456408, awarded by the National Science Foundation. The government has certain rights in the invention.

BACKGROUND OF THE INVENTION

1. Field of the Invention

This invention is directed to the field of semiconductor devices, and more particularly, to designs and methods of fabrication for devices and integrated circuits having improved hardness to total ionizing radiation dose.

2. Description of the Related Art

It is known that MOS (Metal-Oxide-Semiconductor) transistor devices and integrated circuits (ICs) are not inherently tolerant of ionizing radiation. Ionizing radiation is made of energetic subatomic particles, ions, or atoms moving at high speeds, and high-energy electromagnetic radiation such as gamma rays and X-rays, and is especially prevalent in space, in nuclear power plants, in high-energy physics experiments, or in the vicinity of a nuclear explosion. Besides in aerospace, military, and research applications, ICs may also encounter ionizing radiation in medical imaging and other commercial applications. When an MOS device is exposed to ionizing radiation, electron-hole pairs are generated in the various oxide regions, resulting in trapped charge and interface states. The result is a cumulative buildup of positive charge in the oxide due to the Total Ionizing Dose (TID), leading to large negative threshold shifts, and thus to current leakage, particularly in n-type MOS (NMOS) transistors and parasitic devices associated with them. This TID-induced leakage leads at least to increased power dissipation, and can even lead to an operational failure of an integrated circuit (IC) device that incorporates the NMOS transistor.

Techniques exist for growing radiation-hardened ("rad-hard") gate oxide material within a special rad-hard IC fabrication process ("Rad-Hard by Process" or RHBP). But the field oxide regions, which are thicker than the gate oxide, may not be susceptible to these process measures, and radiation-induced parasitic transistors can still occur in circuits fabricating using these "rad-hard" processes. There is thus a current emphasis on specialized device structures and layout techniques that can be used to improve radiation hardness ("Rad-Hard by Design" or RHBD), without requiring a special rad-hard process, to take advantage of advanced commercial CMOS process nodes. RHBD techniques can also be used in combination with RHBP in order to achieve higher levels of radiation hardness.

A number of RHBD design techniques and device structures have been devised for use with LOCal Oxidation of Silicon (LOCOS) processes that are in use for older technology nodes using minimum feature sizes down to approximately 0.25 μm (250 nm). For example, Hatano et al. [H. Hatano and S. Takatsuka, "Total dose radiation-hardened latch-up free CMOS structures for radiation-tolerant VLSI designs," IEEE Trans. Nucl. Sci., Vol. NS-33, No. 6, December 1986, pp. 1505-1509] describe several NMOS transistor structures that utilize a highly p-doped (P+) guard ring structure within the moat regions and a large space between the N+ source and drain and the guard ring. Owens et al. [U.S. Pat. No. 5,220,192] describe moderately-doped p-type guard bands under the "bird's beak" region where the field oxide tapers into the moat region in a LOCOS transistor, with a separation between the guard bands and the N+ source and drain. Groves et al. [U.S. Pat. No. 6,054,367] increase the impurity concentration within the LOCOS bird's beak region using an additional p-type implant of the substrate before formation of the field oxide. Donnelly et al. [U.S. Patent Appl. Pub. No. 2011/0084324] present designs employing heavily-doped p-type guard regions underlying a portion of the LOCOS bird's beak region together with a gap between the guard regions and the n-type sources and drains. Annular "edgeless" transistor designs [see, for example, Mayer et al., "Reliability Enhancement in High-Performance MOSFETs by Annular Transistor Design," IEEE Trans. Nucl. Sci., Vol. 51, No. 6, December 2004, pp. 3615-3620] have also been used to eliminate the edge leakage paths found in standard linear-gate NMOS transistors, but these techniques, like those employing heavily-doped P+ guard rings, do not scale well to the smaller transistor sizes used in more advanced CMOS technologies.

Shallow Trench Isolation (STI) is an example of a newer CMOS process for advanced submicron technologies that uses a different field oxide isolation technology. STI is a successor to the LOCOS process used for nodes having feature sizes below 0.35 μm, and most commonly at 180 nm and less. Although the STI process is quite different from the LOCOS process in its implementation of device isolation, devices and circuits fabricated using an STI process are also susceptible to leakage in parasitic transistors due to exposure to TID. The cross-sectional profiles of the STI field oxide edges, and the resulting electric fields near them, differ from those in LOCOS, and lack the bird's beak tapered thickness profile at the edges of the active regions. Nevertheless, leakage issues can be exacerbated by the high electrical fields occurring at "corners" of the trench insulator (STI field oxide), particularly where gate electrodes, or other interconnects at that level, cross an edge of STI oxide (trench insulator). This problem has been acknowledged in the literature [see, for example, R. Shaneyfelt et al., "Challenges in Hardening Technologies Using Shallow Trench Isolation," IEEE Trans. Nucl. Sci., Vol. 45, No. 6, December 1998, pp. 2584-2592], and various solutions have been proposed, including edgeless or edge-reduced devices [e.g. Sadd et al., U.S. Pat. No. 7,906,805 applying these to flash memory cells]. But design techniques and device structures that were devised for use in LOCOS technology, with its bird's beak field edge profiles and different mask layers, are not directly applicable to transistors and ICs made using the STI process.

As ICs are scaled to submicron characteristic dimensions, parasitic resistances increase on both gates and source-drain regions. Metal silicides, including compounds of tungsten (W), titanium (Ti), nickel (Ni), cobalt (Co), platinum (Pt), palladium (Pd), molybdenum (Mo), and tantalum (Ta), have been incorporated into submicron IC processes such as those using STI to increase the conductivity of polysilicon gates, and to reduce the sheet resistance of silicon source/drain regions as well as to improve their contact resistance to metal. Silicides (sometimes called "polycide" on the polysilicon gate and "salicide" for "Self-Aligned siLICIDE" on the source and drain) are most commonly formed by depositing the metal onto exposed silicon and performing an anneal to react the metal with the silicon to form metal silicide, although sputtering or chemical vapor deposition (CVD) techniques are possible for some of the compounds. Both process and layout techniques require adaptation in order to successfully integrate silicide into an IC, and rad-hard layout techniques are needed that comprehend the existence of the silicide layer in the process.

High-voltage transistors, i.e., those whose designs enable them to achieve large drain-source breakdown voltages $BV_{DS}$, are commonly implemented either using a vertical design in discrete devices, or for integration in ICs, using a lateral design such as Laterally-Diffused MOS (LDMOS) or Drain-Extended MOS (DEMOS). The small on-resistance and capacitance of lateral devices make them more suitable for high-frequency operation than vertical devices. Lateral high-voltage transistors are used for electrostatic discharge (ESD) protection of input/output devices, and to integrate high-voltage drive capabilities, and there is a need to implement radiation-hardened versions of these devices into advanced commercial processes that use STI. The radiation hardness (TID response) of some of these types of transistors is evaluated, and the application of some RHBD techniques adopted from low-voltage designs is discussed by Faccio et al. ["TID and Displacement Damage Effects in Vertical and Lateral Power MOSFETs for Integrated DC-DC Converters," IEEE Trans. Nucl. Sci., Vol. 57, No. 4, August 2010, pp. 1790-1797], and Duncan et al. ["Strategic Radiation Response of Analog Circuits on a Commercial Bulk 180-nm High-Voltage LDMOS Process," Journal of Radiation Effects, Vol. 34, No. 1, December 2016, pp. 227-236]. But there remains a need for additional design techniques to improve TID radiation hardness beyond these early efforts.

To more fully illustrate issues to be addressed, refer to FIG. 1A, showing a simplified plan-view layout of an example of a basic prior art low-voltage NMOS transistor 100. A linear gate 106 of length L crosses an active region defined by ACTIVE mask pattern 102, within which the STI "field oxide" trench insulator is not formed, but instead where a thin gate oxide underlies the (typically polysilicon) gate 106. NSD pattern 108 is generally coincident in the prior art with ACTIVE 102 in areas where a transistor 100 is to be fabricated. Pattern 108 is used as an opening over the active region for implanting N+ source and drain areas 110a and 110b (these areas are functionally identical until they are connected in a circuit, after which the area driven at a lower voltage is conventionally defined to be the source).

One of the most troublesome types of leakage paths that can be induced by radiation is along the edges of the trench insulator (STI oxide) in the opening defined by ACTIVE pattern 102 that lie underneath transistor gate electrode 106, as shown by the curved arrows 120 on the left and right sides of the diagram. The resulting increase in leakage current below threshold can be seen in FIG. 1B [from T. R. Oldham and F. B. McLean, "Total ionizing dose effects in MOS oxides and devices," IEEE Trans. On Nuclear Science, Vol. 50, No. 3, December 1998, pp. 483-499], where a graph 130 showing I-V curves before and after TID radiation is presented. The relevant curves related to parasitic edge devices are curve 122, marked "PRERAD (field or edge)" [before radiation exposure] and curve 124, marked "POSTRAD (field or edge)" [after radiation exposure]. Thicker oxides build up more charge with TID, and thus the thick field oxide regions along the edges of transistors tend to result in greater turn-on voltage shifts than those due to radiation-induced charging of the thin gate oxide. Radiation induces the formation of parasitic devices that leak under gate 106 along these thick edges and in equivalent places in the circuit layout. The effect of charges induced by radiation building up in the thin gate oxide result in a much smaller threshold shift from the curve indicated by curve 132 marked "PRERAD (gate)" to curve 134 marked "POSTRAD (gate)." The total I-V curve from both effects is marked "COMBINED" and it approaches curve 124 at low voltages and curve 134 above turn-on of the parasitic device at higher voltages.

FIG. 1C shows a set 140 of I-V curves showing the effect of radiation on a type of high-voltage (50 V) drain-extended NMOS (DENMOS) device that will be described in detail later. Curve 142 shows the I-V curve for a Total Ionizing Dose (TID) of zero kilorads (krads). It can be seen that subthreshold leakage currents become significant at 20 krads (curve 144), and the device becomes essentially non-functional in curve 146, at a TID of 200 krads. Curve 148 is the expected I-V curve at 200 krads TID for an improved device constructed according to the principles of the present invention, showing only a small threshold shift attributable to radiation-induced gate oxide charge buildup, analogous to curve 134 in FIG. 1B.

There remains a need to further improve the radiation hardness of MOS devices and circuits fabricated using Shallow Trench Isolation technology and associated silicidation processes, and in particular the NMOS devices therein, with minimal impact on circuit density, and requiring minimal alterations to commercial STI processes.

SUMMARY OF THE INVENTION

Exemplary embodiments of the present invention provide a structure for a radiation-hardened NMOS transistor device fabricated using a shallow trench isolation process, that exhibits improved hardness to Total Ionizing Dose radiation by substantially increasing the threshold of a parasitic field transistor; a radiation-hardened integrated circuit containing such an inventive NMOS transistor; an integrated circuit having an isolation structure that reduces radiation-induced leakage current between neighboring devices; and a fabrication process for making a radiation-hardened device or an integrated circuit including such NMOS transistor devices or improved isolation structures.

More specifically, the present invention provides an NMOS transistor fabricated using a shallow trench isolation process and formed in a lightly-doped p-type substrate, the transistor having an active region defined by an area on the top surface of the substrate where a trench insulator is not present and a gate crossing the active region with a length dimension defining at least one channel under the gate. The transistor includes an n-type region formed within the active region having at least one segment of a border pulled back from the edge of the trench insulator along a boundary of the active region crossed by the gate, the pulled-back segment defining a gap region in the active region outside the n-type region. The gap region increases the turn-on threshold voltage of a parasitic field transistor formed along the edge of the trench insulator under the gate. A metal silicide layer is disposed on top of, and in electrical contact with, the n-type region, and is excluded from the gap region, preventing the silicide layer from establishing a connection from the n-type region to the substrate in the gap region. Another exemplary embodiment provides an NMOS transistor as described above further including a moderately-doped p-type band formed along the edge of the trench insulator under the gate extending at least along the entire length of the channel. Yet another exemplary embodiment provides a high-voltage NMOS transistor having an annular gate and designed according to the principles of the present invention.

The present invention also provides a method for fabricating an NMOS device using a shallow trench isolation process. A trench insulator is formed in areas of a P− substrate that are not to be used as active regions by forming a masking layer over a pad oxide layer on the substrate, patterning the masking layer to define at least one active region, etching a trench in areas not covered by the masking layer, depositing a trench insulator material, and planarizing the trench insulator so that its top surface is substantially coplanar with the masking layer. The masking layer and pad oxide are removed from the active region, and a gate oxide is grown and a gate layer deposited. The gate is patterned and etched, and the gate oxide is removed from areas of the active region not covered by the gate. The exposed substrate is patterned and implanted with N+ doping to form source and drain regions, using a mask pattern wherein at least one segment of a border of a source or drain region is pulled back from the edge of the trench insulator into the active region leaving a gap region within the active region between the n-type region and the edge of the trench insulator. A metal silicide layer is formed on the top surface of the substrate, where gate oxide has been removed, in such a way that it is prevented from forming in the gap region. Finally, the rest of the steps in fabricating the NMOS device are completed.

The present invention further provides a radiation-hardened integrated circuit fabricated using a shallow trench isolation process. The integrated circuit includes one or more other devices in addition to an NMOS transistor designed according to the principles of the present invention and structured as previously described to include a source or drain region pulled back from the edge of the trench insulator into the active region defining a gap region and a metal silicide layer that is excluded from the gap region.

The present invention additionally provides a radiation-hardened integrated circuit fabricated using a shallow trench isolation process wherein one of a pair of neighboring devices is an NMOS transistor designed according to the principles of the present invention. In the NMOS transistor, at least one segment of a border of a source or drain region is pulled back from the edge of the trench insulator proximate a neighboring device into the active region, leaving a gap region within the active region between the n-type region and the edge of the trench insulator proximate the neighboring device, and a metal silicide layer is excluded from the gap region. The neighboring device may be another NMOS transistor or an n-well, and if the neighboring device is an NMOS transistor, it may also be designed according to the principles of the present invention. Additional exemplary embodiments further include a moderately-doped p-type band formed under the gate extending at least along the entire length of the channel along the edge of the trench insulator proximate the neighboring device to further reduce the leakage current between neighboring devices.

Other features and advantages of the present invention will be apparent to those of ordinary skill in the art upon reference to the following detailed description taken in conjunction with the accompanying drawings, which are to be understood to be exemplary and explanatory, and are intended to provide further explanation of the invention as claimed.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description. Embodiments of the present disclosure are generally directed to semiconductor devices and integrated circuits, and methods for fabricating the same. Conventional techniques related to integrated circuit device design and fabrication may not be described in full detail herein, and the various tasks and process steps described herein may be incorporated into a more comprehensive procedure or process having additional steps or functionality. In particular, various steps in the manufacture of semiconductor-based integrated circuits are well-known and so, in the interest of brevity, many conventional steps may be mentioned only briefly herein or may be omitted entirely without providing well-known process details. For example, the use of the word "patterned" implies the steps of applying photoresist (resist), exposing the resist to light using a photomask, and developing the resist to create a patterned masking layer, subsequent to which an ion implantation, etching or deposition step may occur through the patterned resist to create a structure having the lateral shape of the exposed and developed resist pattern.

It will be apparent to those skilled in the art that the techniques and structures for device layouts, and the integrated circuit processing fabrication methods that will be described herein, have application to a wide variety of metal-oxide semiconductor (MOS) devices, having different device structures and in different variations of MOS technologies, including, but not limited to, standard CMOS, laterally diffused MOS (LDMOS), and drain-extended MOS (DEMOS). Applications of the present invention to examples of standard CMOS and DENMOS (n-type DEMOS) devices are illustrated and described below. The designs or device layouts can in some embodiments be implemented in existing CMOS processes using only simple layout changes to improve (increase) the radiation hardness to Total Ionizing Dose (TID) of existing circuit designs, without significantly affecting circuit performance parameters such as speed, power, die area, etc.

Figure 1A:
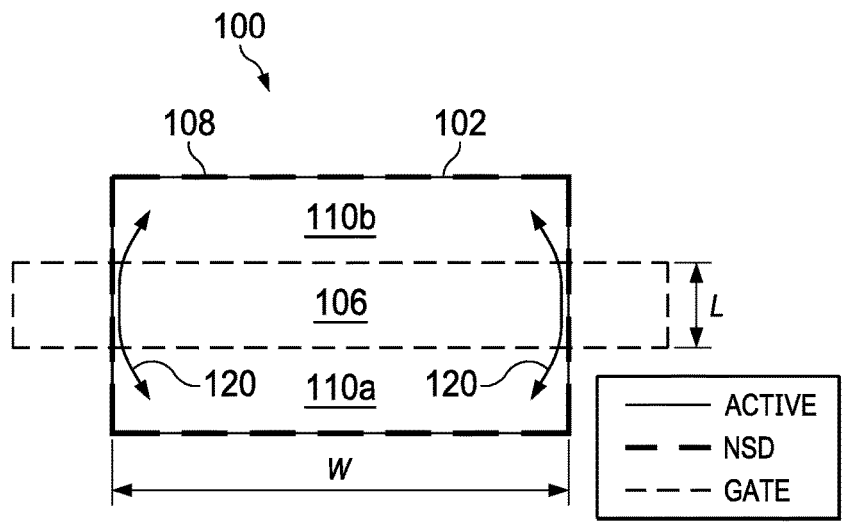
FIG. 1A is a schematic plan view or mask layout of a prior art NMOS transistor showing TID-induced leakage paths.
Figure 1B:
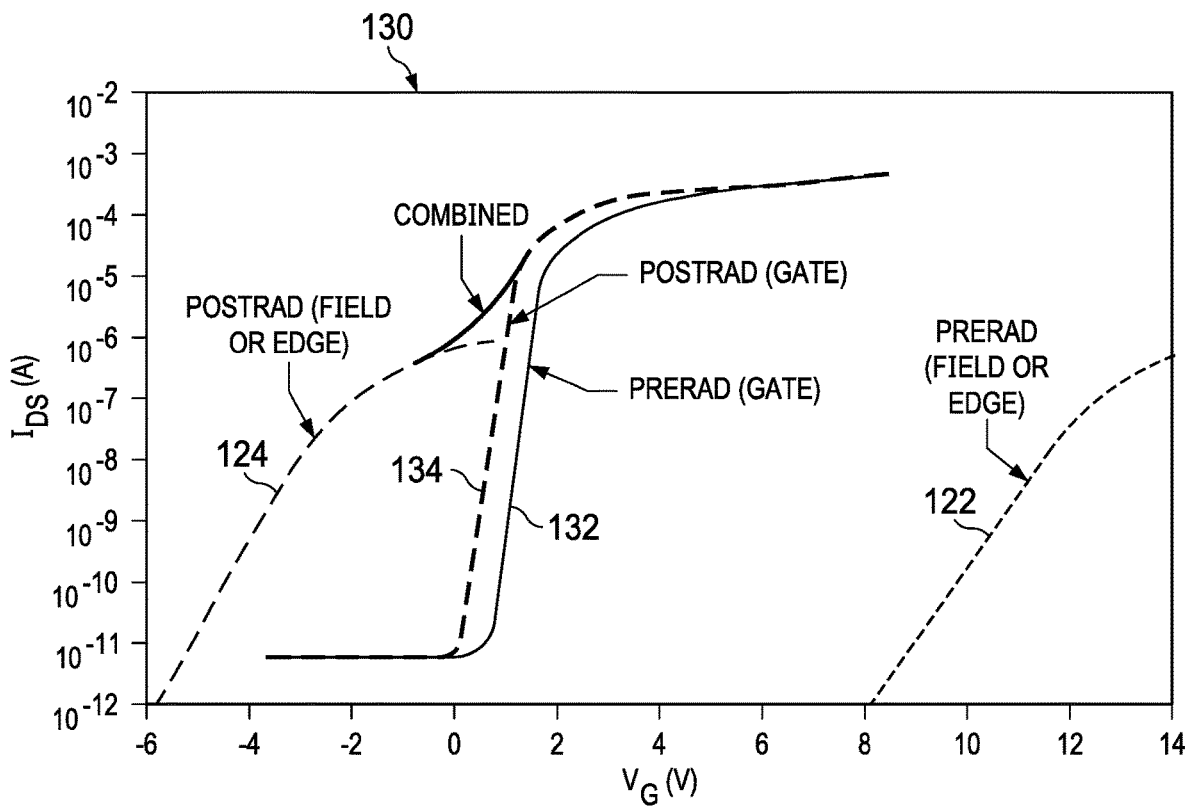
FIG. 1B is a graph showing exemplary pre-radiation and post-radiation I-V curves for a prior art NMOS transistor.
Figure 1C:
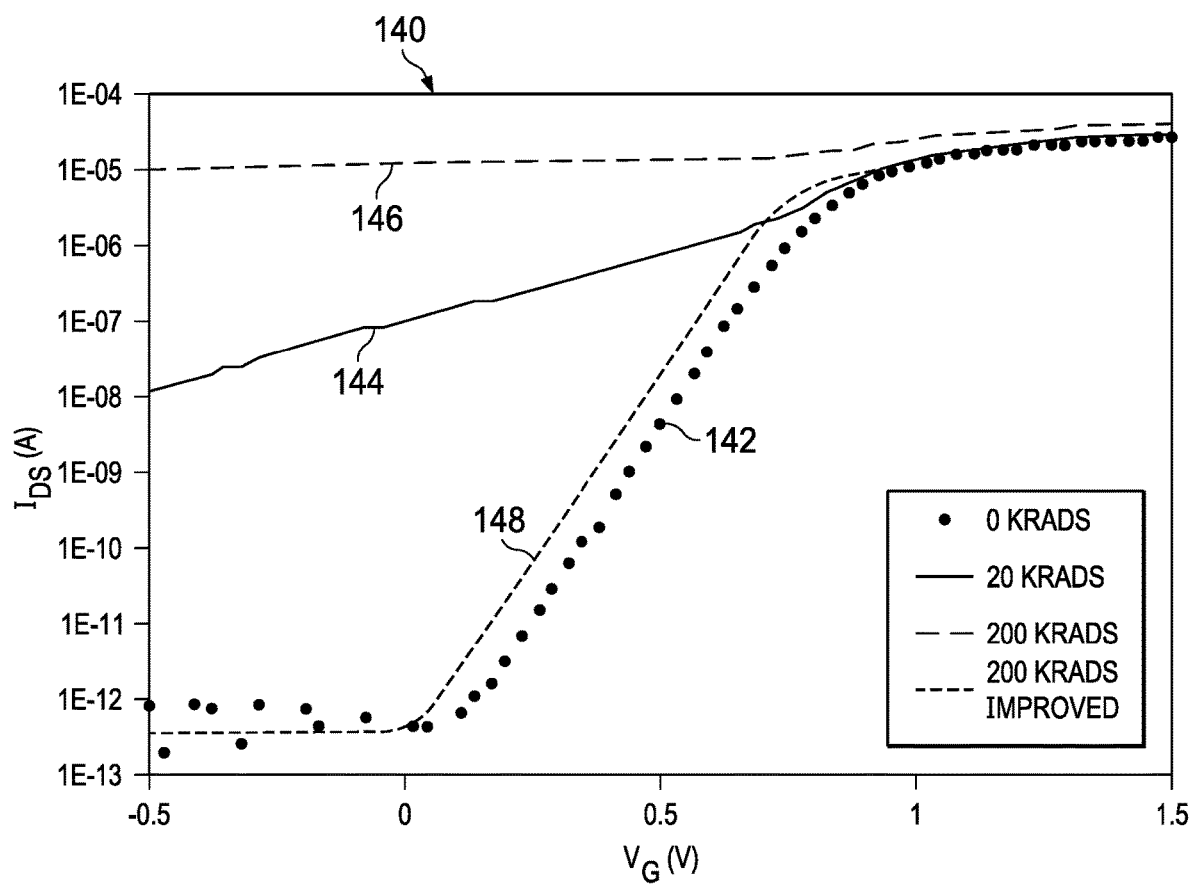
FIG. 1C is a graph showing projected pre-radiation and post-radiation I-V curves for a DENMOS transistor designed according to an embodiment of the present invention.
Figure 2A:
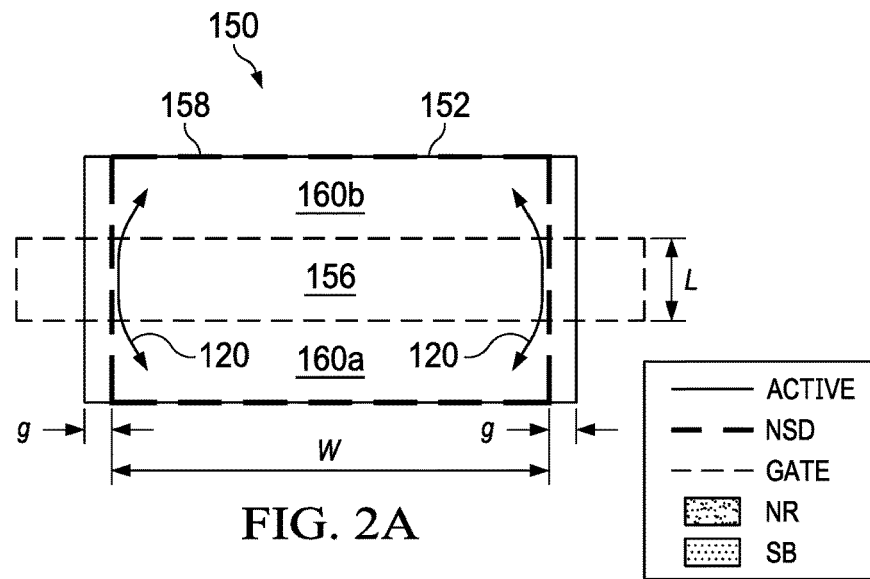
FIGS. 2A-2C are schematic plan views or mask layouts of transistors according to embodiments of the present invention.

Referring now to FIG. 2A, a simplified mask layout is presented (which can also be understood as a simplified and idealized plan view of a semiconductor device) showing one embodiment of an n-type standard CMOS (NMOS) transistor 150 according to the present invention and illustrating a basic principle of the invention. In this embodiment, rather than being coincident with the edges of the ACTIVE pattern 152 that pass under gate 156, as is the case in the conventional prior art transistor of FIG. 1A, the left and right edges (as shown in this view) of NSD (N source/drain) mask pattern 158 used to define the N+ implanted regions forming the source and drain regions 160a and 160b of NMOS transistor are "pulled back," i.e., away from the left and right edges of ACTIVE 152 and into the active region by a small distance or "gap" g. NSD 158 is indicated by a thick dashed line, and ACTIVE 152 is indicated by a thin solid line. Pulling back the NSD mask pattern in this results in a transistor that, when fabricated, has a gap between the corresponding edges of the source/drain and the edges of the STI field oxide that pass under the gate. Separating the edges of the n-type source and drain 160a and 160b by a gap g from STI edges that pass under gate electrode 156 increases the turn-on or threshold voltage of parasitic field transistors formed under gate 156 by removing the leakage path 120 from along the STI edges under the gate, which have high electric field concentrations due to structural corners in the cross-sectional profile of the STI field oxide at these edges. With the NSD pullback, current leaking along the STI edge under gate 156 has to further traverse the gap region, which is lightly-doped p-type and not implanted N+. Thus radiation-induced parasitic field transistors are mitigated by increasing their turn-on voltage and reducing their associated leakage currents. The channel length L of the modified transistor is still defined by the length of gate 156 (in the length direction defined by L), and the width W of the transistor is determined by the width of the NSD implanted source and drain regions 160a and 160b, which in this embodiment is narrower than the width of the active region by twice the gap g, assuming that the same value for g is used on both left and right sides of the transistor layout and neglecting alignment errors. No additional mask layers are required to implement this technique.

Figure 2B:
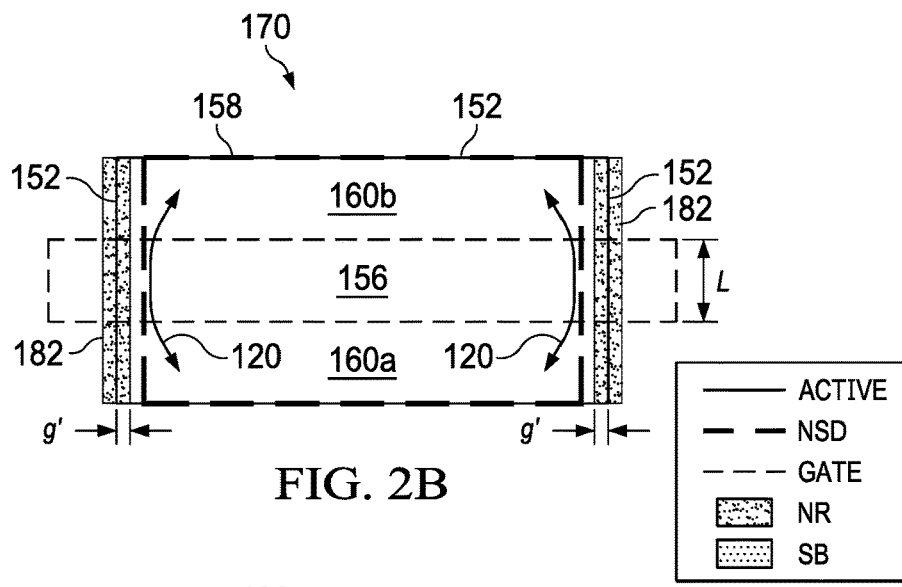

An alternative embodiment of the present invention is shown in schematic plan view in FIG. 2B, which shows an NMOS transistor 170 in which not only is the NSD pattern 158 pulled back from the ACTIVE pattern 152 by a gap g (not labeled), but there are further one or more p-type doped regions or "bands" 182 formed along the (left and right in this diagram) edges of the active region that pass under gate 156. These regions are labeled "NR" and indicated by an irregularly stippled fill pattern. In the embodiment shown, p-type bands 182 are formed along the STI edges 152 that pass under gate 156 using a mask pattern with bands having a nonzero width that extends by an overlap g' into the active region (i.e., into the gap region between source and drain defined by NSD 158 and the STI edge defined by ACTIVE 152, having a width g that is not labeled in FIG. 2B) and also optionally some distance outside the active region (e.g., toward the right on the right-hand edge). The distance that the NR mask pattern extends outside the active region is not critical since the field oxide will mask the p-type implant in those areas. However, in order to ensure that the edge region of the STI field oxide is implanted sufficiently with p-type impurities, the NR mask pattern 182 is preferably oversized in this direction by a distance that accommodates lithography pattern size and misalignment tolerances, a technique that is familiar to those skilled in the art. These p-type bands 182 further increase the threshold voltage (and thus reduce the leakage current at a given gate voltage) of parasitic transistors that are formed at the ACTIVE 152 STI edge under crossings of gate electrode 156. The p-type bands 182 may be formed using an additional p-type (e.g. boron) implant using a dose that results in a moderate p-type doping level. A mask called "NR" used for a p-type threshold voltage adjust implant step exists in many CMOS processes, and a modification of this mask may be used to pattern the moderately-doped p-type bands 182. Although another p-type implantation step at a different doping level optimized for these p-type bands may be used in some embodiments, no additional mask layers are necessarily required to implement this variation of the invention, simply a change in the NR mask layer. The NR mask may optionally be used for both the threshold voltage adjust implant and the p-type band implant. In some embodiments, the implantation step for the p-type bands may be directed at an angle with respect to the normal of the silicon substrate, so as to more thoroughly expose the relevant edge structures under where the gate crossings will be fabricated later in the process.

Figure 2C:
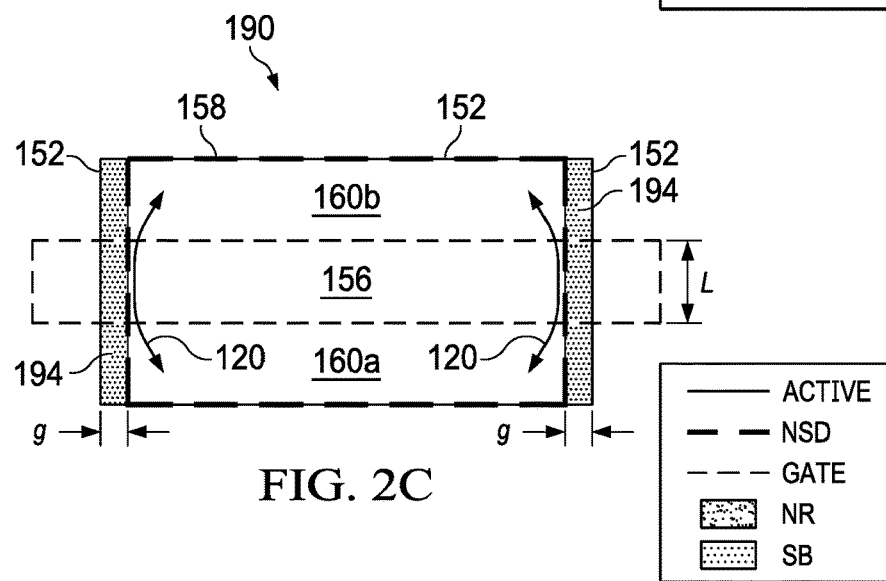

Referring now to FIG. 2C, a mask layout or schematic plan view of an NMOS transistor 190 constructed according to another embodiment of the present invention is shown. In this embodiment, NSD pattern 158 is pulled back on the left and right edges from ACTIVE pattern 152 in the same manner as in FIGS. 2A and 2B, and by the same gap distance g in the width direction, so that, as in FIGS. 2A and 2B, n-type source and drain regions 160a and 160b are separated by gap regions of approximate width g from the left and right edges of the STI field oxide. A "silicide block" mask SB exists in some processes to define areas in which metal silicide is not to be formed. In this embodiment, a silicide block pattern 194 on the SB mask is used to cover the gap regions. Pattern 194 prevents silicide formation in the gap regions, thereby preventing the silicide layer from establishing a conductive connection from the n-type regions (source and drain) to the p-type silicon in the gap region, which could result in various undesirable short circuits. Pattern 194 may be oversized using appropriate design rules, as is known to those skilled in the art, to ensure that silicide is not formed bridging the boundaries between the n-type (source/drain) regions and the gap regions, in spite of misalignment and size tolerances. Although not illustrated in FIG. 2C, this embodiment can be used in combination with p-type bands 182 as shown in FIG. 2B.

Figure 3A:
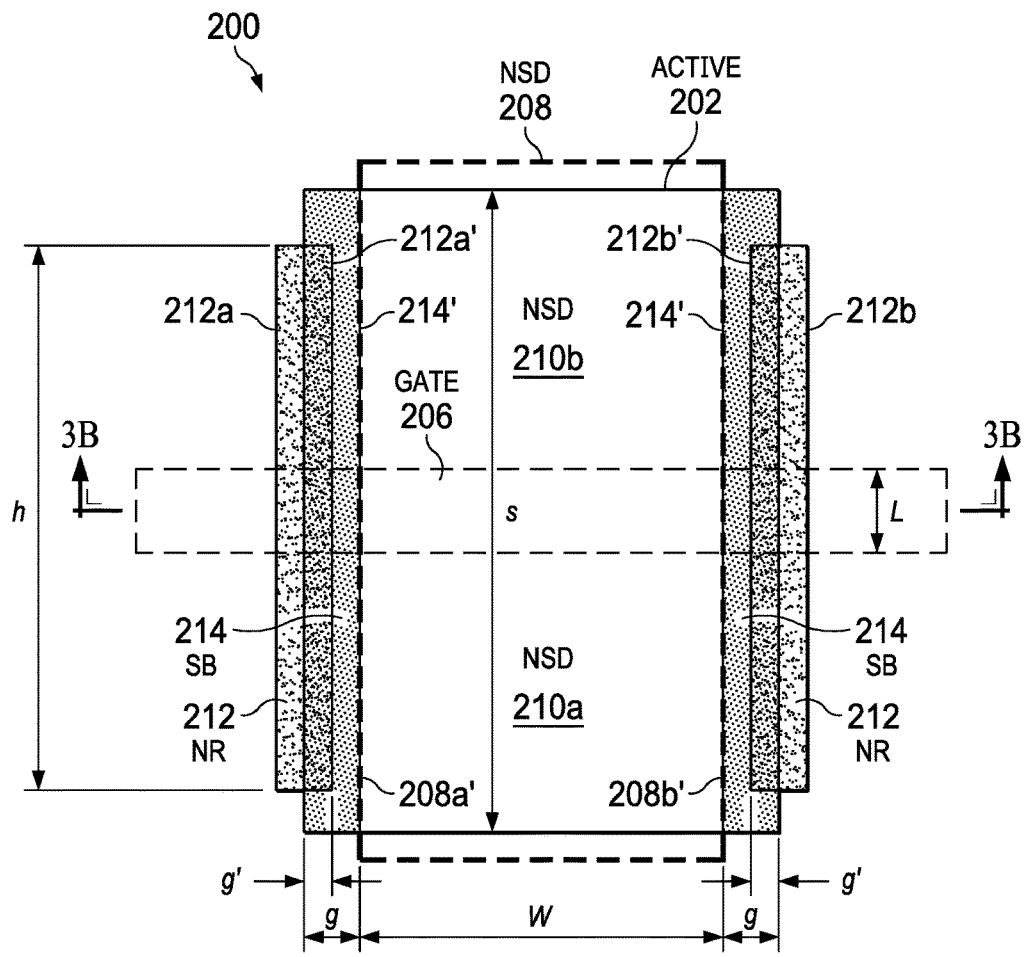
FIG. 3A is a schematic plan view or mask layout of an NMOS transistor according to an embodiment of the present invention.

Referring now to FIG. 3A, a detailed schematic layout of an exemplary NMOS transistor 200 according to an embodiment of the present invention is shown. This exemplary layout is used to illustrate several principles of the present invention. A typical rectangular layout is shown, although other shapes are possible; the rectangular layout shown is typically used in low-voltage transistors, e.g., those having drain-source breakdown voltages of 5 V or less. The NMOS transistor may be formed on a lightly-doped p-type substrate, an epitaxial layer, or in a p-well (not shown). The gate electrode pattern 206 extends across the transistor from left to right across the center, and has a gate length L defining a channel. The width of the NSD pattern 208 defines the transistor width W. Although in some embodiments (e.g., as shown in FIGS. 2A-2C) the upper and lower edges of NSD 208 may be coincident with the pattern for ACTIVE 202, in this embodiment the NSD pattern 208 is longer in the vertical direction than the rectangle for ACTIVE 202. This is not essential, but is drawn in this way to easily distinguish NSD 208 and ACTIVE 202 patterns, and to indicate possible variations of the present invention that do not detract from the device performance. The source and drain for the NMOS transistor are indicated by the regions labeled 210a and 210b; which region is used as a source and which as a drain is determined by its connection in the circuit and applied voltages, as is well known. The extent of a thinned oxide to form an NMOS transistor is shown by the solid line boundary 202 (ACTIVE), which defines an area outside of which a field oxide (STI trench insulator) is formed. It can be seen that the NSD pattern 208 has been narrowed on the left edge 208a' and right edge 208b' so as to be pulled back from the STI edge as described in reference to FIG. 2A. The amount of the "pullback" is again indicated by variable g, which will be referred to as the "gap" meaning the width of a "gap region" between the NSD implant and the STI edge. A gap g of less than one micrometer may be used in a submicron process, but a nonzero gap is required after considering size and alignment tolerances during fabrication. A reasonable gap or pullback distance for fabrication may be 0.3 µm or greater in a 180-nm process. The width of the gap g is shown in FIG. 3A to be the same on both left and right edges of the transistor, although this is not essential, as long as a minimum gap is maintained to achieve a desired radiation hardness (i.e., to keep leakage current in the device/circuit below a predetermined value for a specified Total Ionizing Dose).

An additional (optional) p-type band to further increase radiation-induced parasitic threshold voltage (increase the voltage required to turn on the parasitic edge transistors, as described in reference to FIG. 2B) is indicated in FIG. 3A by pattern 212 (NR) to be used in conjunction with a moderate-dose p-type implant. This implant is used to further increase radiation hardness, and may not be necessary in cases where a radiation tolerance goal is relatively low. Pattern 212 is placed fundamentally along the edge of STI pattern 202 in order to place boron dopant under and along the inner edge of the trench insulator, as described above with regard to FIG. 2B. It can be seen that there are some options in the placement and size of the NR pattern 212. The NR pattern 212 is placed so that the p-type implanted species is positioned in the region under the crossings of gate 206, but the extent h of the NR pattern along the edges is variable. h may be less than s as shown, but is preferably at least as long as the gate length L and positioned thereunder, in order to have the desired effect on parasitic edge transistors formed under the gate; but the vertical (as shown in FIG. 3A) extent of the NR pattern 212 can extend most of the way along the ACTIVE 202 opening, or all of the way, or past the ACTIVE 202 opening, or even completely encircle the device. The extent of the NR implant from the edge of the STI oxide (ACTIVE 202) toward the center of the device is also variable, as indicated by inner edges 212a' and 212b' that extend by a variable distance g' into the gap width g. This variable g' will be referred to as the "overlap." and g' can range from zero (no overlap into the gap) to less than g. Outer edges 212a and 212b of NR pattern 212 may extend as shown past the STI edge (defined by ACTIVE 202) without much impact on device performance, but some overlap into the field oxide is desirable to guarantee p-type doping of the edges of the STI field oxide that participate in the leakage due to parasitic field transistors along these edges.

Also shown in FIG. 3A is the silicide block pattern 214 (SB, an abbreviation for "silicide block"). The SB 214 pattern has a vertical (in this diagram) extent labeled with the variable s, that is the same as the vertical extent of the ACTIVE 202 opening in order to prevent a conductive connection from source or drain 210a and 210b to silicon in the gap region. Also significant are the positions of the inner edges (which preferably are coincident with the NSD outer edges as shown by edges 214'), and the outer edges (unlabeled) which extend to the STI edge (ACTIVE 202, edges not labeled, but these are the vertical left and right edges). The inner edges of SB 214 at least "touch" the NSD pattern 208, and can extend somewhat into the NSD region (preferably a minimal amount, such as might be produced by photolithography errors, in order to maximize silicide coverage over the source/drain region for minimum sheet resistance). SB 214 may also overlap the trench insulator (i.e., extend outside ACTIVE 202) without much impact on device performance. The SB pattern 214 may be oversized in certain directions according to process design rules to ensure that silicide does not extend into the gap region after comprehending fabrication tolerances.

Figure 3B:
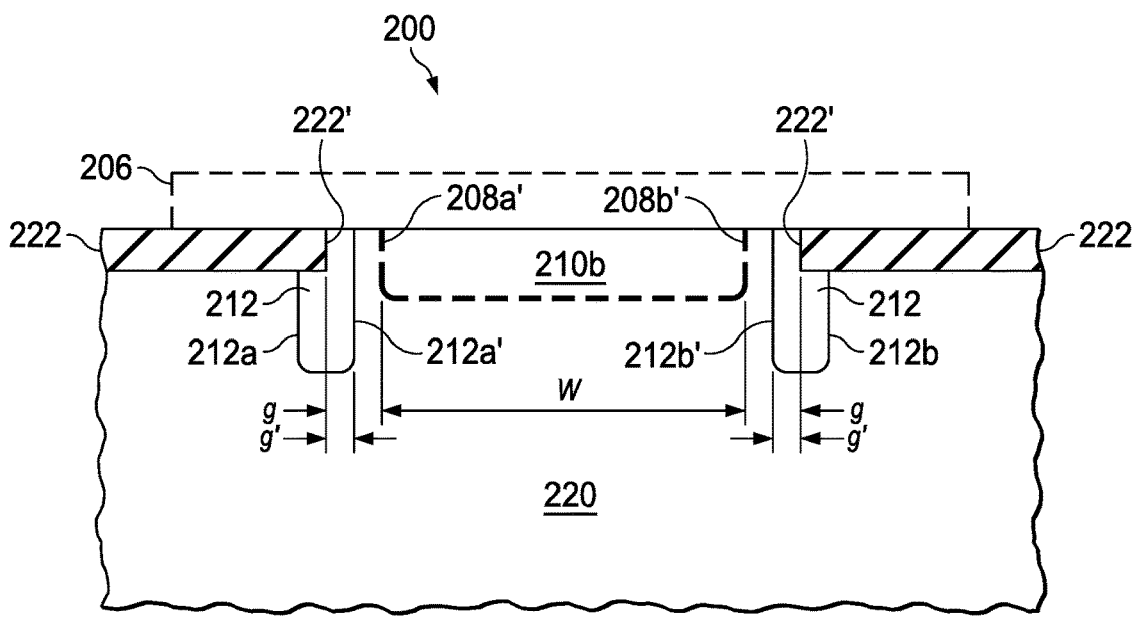
FIG. 3B shows a schematic cross-section view of the transistor of FIG. 3A.

Turning now to FIG. 3B, a simplified schematic cross-sectional view of the device 200 in the layout of FIG. 3A is shown looking toward NSD source or drain implant 210b. For clarity, areas that might be covered by silicide are not shown in this cross-section. Edges 208a' and 208b' defining width W can be seen pulled back by gap g from the inside edges 222' of STI trench insulator 222. The substrate 220 is typically a low-doped p-type (P−) epitaxial layer (P− epi) on a highly-doped (P+) silicon wafer, but as previously mentioned, could be a p-well in an n-type layer or region. The positions of the optional implanted p-type bands 212 with respect to trench insulator 222 and NSD implant 210b are more obvious in this view. For clarity, the depth of the p-type implanted regions 212 are shown as deeper than that of trench insulator 222 and the depth of source/drain implant 210b; but in practice, the implant for the p-type bands may extend no deeper, or not much deeper, than the depth of the trench insulator 222. Again, the positions of the p-type bands 212 may be varied, and this can be seen by the variability of the positions of inner edges 212a' and 212b' and outer edges 212a and 212b. In particular, in this example, edges 212a' and 212b' are shown with a nonzero overlap g' into the gap regions (not labeled with reference numerals, but indicated by gap widths g). Increasing the overlap g' may increase radiation hardness by increasing the turn-on voltage of parasitic field edge transistors. But using too large a value of g' so that it approaches the source and drain may reduce the breakdown voltage of the device, and as the doping level of the p-type band is increased, the distance (g−g') between source/drain and p-type band should also be increased to maintain the same breakdown voltage. Similarly, in this example, outer edges 212a and 212b of p-type bands 212 are shown extending partway underneath trench insulator (STI field oxide) 222. Coincidence of the outer edges of NR 212 with the inner edge of ACTIVE 202 may be sufficient, but some overlap underneath the field oxide, e.g. 0.25 to 0.5 micrometers might improve radiation hardness. Optimum values for position and width of the p-type bands 212 (together determined by the locations in the NR pattern of outer edges 212a and 212b, as well as inner edges 212a' and 212b') can be decided e.g. by experiment in order to achieve particular predetermined desired radiation hardness and performance specifications.

Figure 3C:
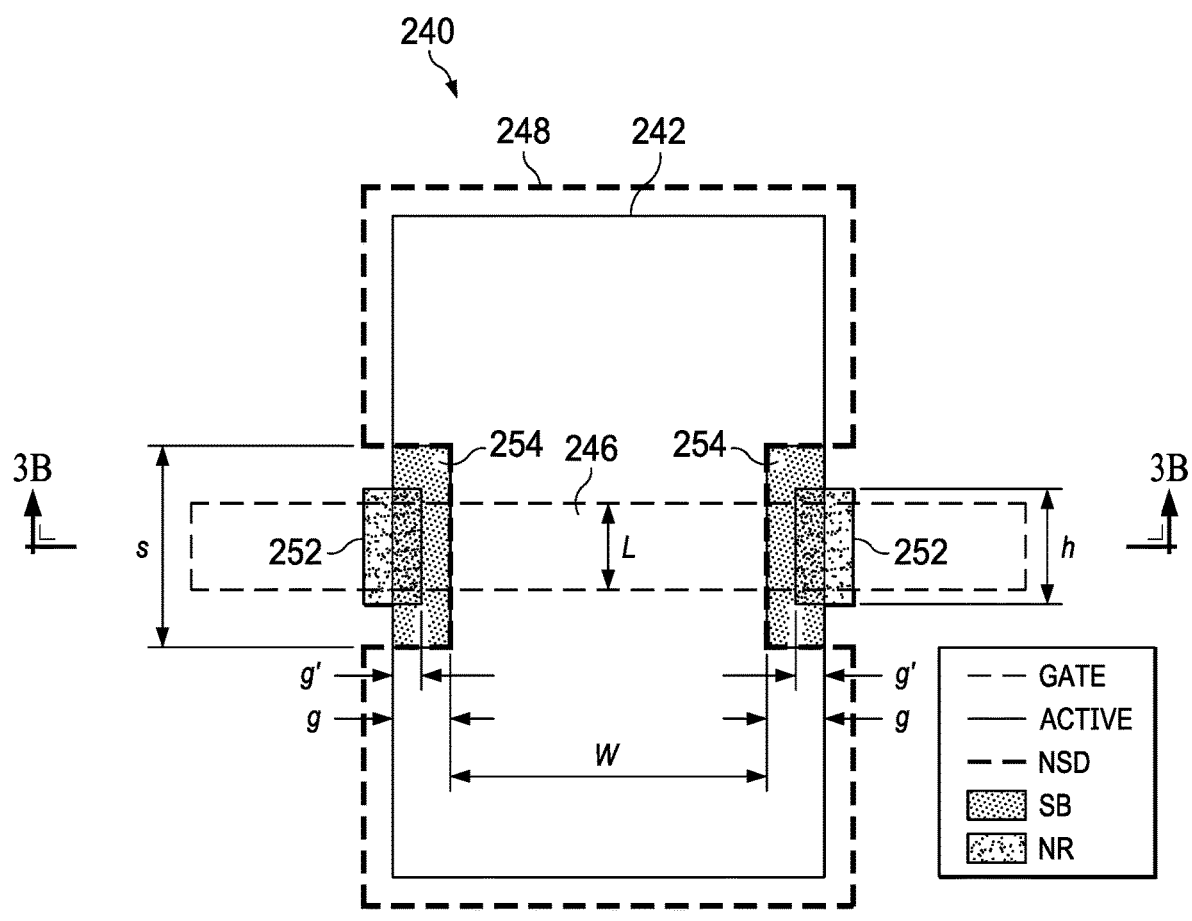
FIG. 3C shows a schematic plan view or mask layout of an NMOS transistor according to another embodiment of the present invention.

FIG. 3C depicts a schematic plan view or mask layout of an NMOS transistor 240 illustrating another exemplary embodiment of the present invention. In this layout, gate 246 of length L crosses active region defined by the rectangular pattern ACTIVE 242, and NSD pattern 248 is shaped so as to define shorter gap regions filled by silicide block pattern SB 254, and is notched-in on the sides along the gate 246 as shown, to a narrower width W than the rectangular active region 242. The length s of the gap regions/silicide block 254 as well as length h of p-type bands 252 defined by the NR mask pattern are shown as significantly shorter than the vertical (length) extent of ACTIVE 242, demonstrating features that are small in the length direction. In order for the p-type bands 252 to be effective, the bands should be located as shown at least under the gate 246 where it crosses the left and right edges of ACTIVE 242 (i.e., where it crosses the edge of the trench insulator forming the edges of the active region), i.e., h should be at least as long as the channel length L. In fact, h is preferably slightly larger than L to interact with fringing fields from the edges of the gate, e.g. extending 0.4 micrometers beyond each edge of the gate 246 such that h=L+0.8 µm. It can be seen that the cross-section 3B-3B through the width of the gate in FIG. 3C appears identical to the cross-section of the NMOS transistor illustrated in FIG. 3A that is shown in FIG. 3B.

Figure 4A:
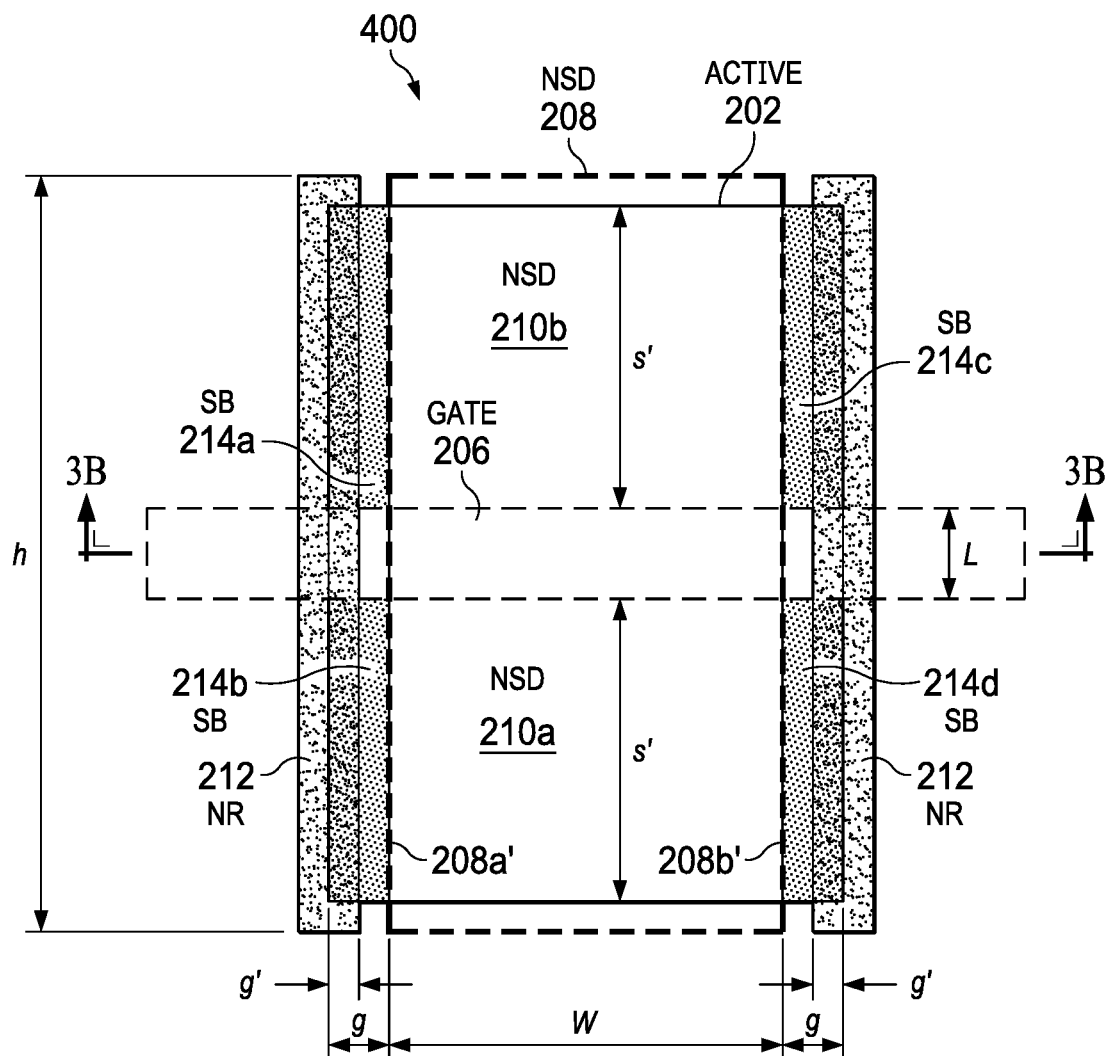
FIGS. 4A-4B are schematic plan views of transistors according to two more embodiments of the present invention.
Figure 4B:
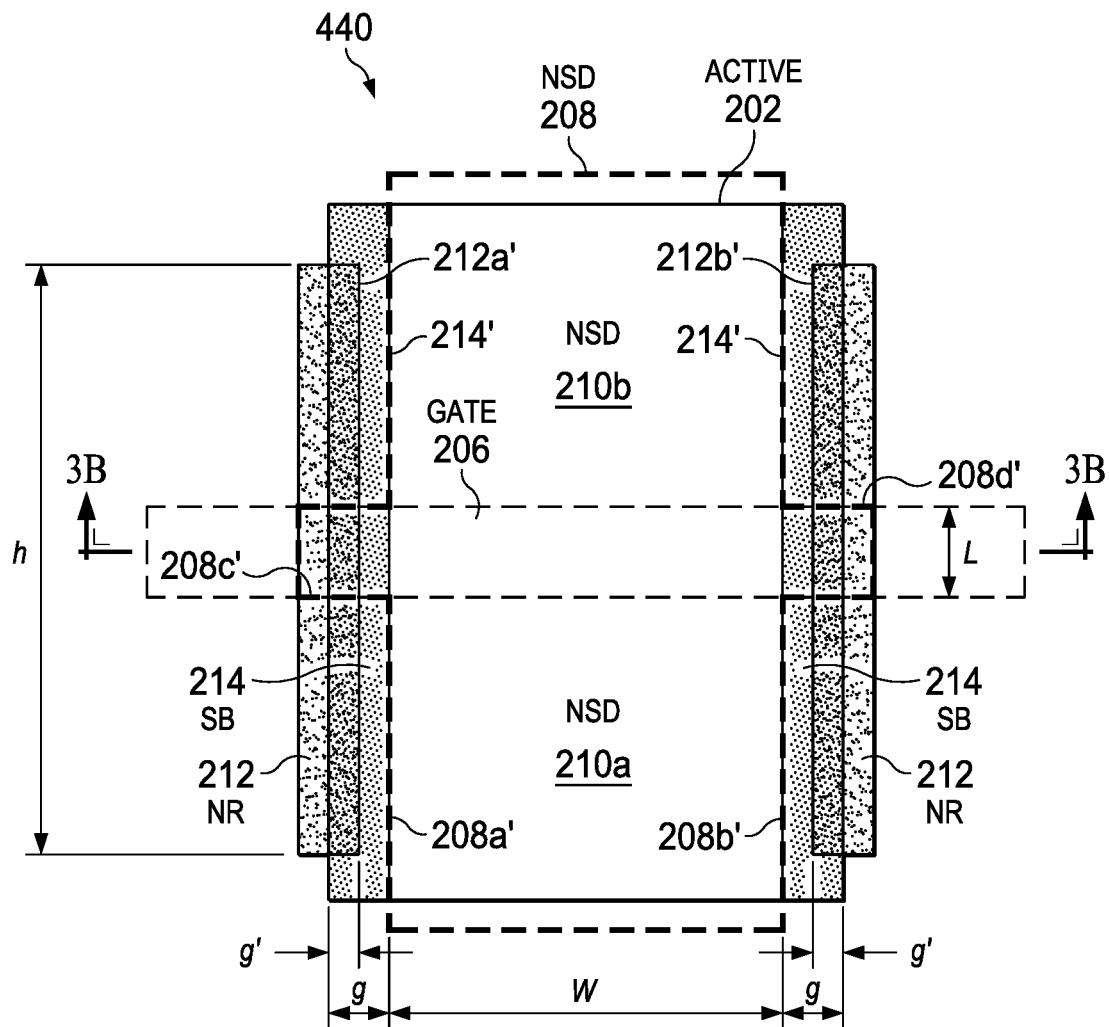

Alternative embodiments still adhering to the principles of the present invention are illustrated in FIGS. 4A and 4B, which are plan views of NMOS transistors 400 and 440, respectively. Referring first to FIG. 4A, radiation-hardened NMOS transistor 400 incorporates pullback of the NSD 208 on left edge 208a' and right edge 208b' similar to the previous layout examples. In this case, however, the silicide block pattern does not extend across gate 206. It is recognized that the gate 206 can benefit from reduced resistance offered by a continuous silicide layer all along the gate, and removing the silicide block pattern from over the gate allows silicidation or deposition to occur on the entire gate surface, even where it crosses the gap regions. The resulting SB pattern comprises not two rectangular regions but four, indicated by reference numerals 214a, 214b, 214c, and 214d, each having a length s' and width g as shown. FIG. 4A is also used to illustrate an embodiment in which p-type bands 212 extend beyond the ends of ACTIVE 202 in the length direction, having length h that is longer than the active region in that direction, longer than the gap regions.

Another way to improve the conductivity of gate 206 is shown in FIG. 4B, depicting an NMOS transistor 440 according to another embodiment of the present invention in which the NSD 208 pattern is extended over the gate 206 in the width direction to increase the width of the gate over which N+ doping is applied during the NSD implant. This is done in this exemplary embodiment by adding extensions or "tabs" 208c' and 208d' on the left and right sides of NSD 208 over gate 206 that are shown as equal to the length of the gate L. In practice, these tabs 208c' and 208d' would be sized to be shorter (narrower in the vertical direction) than L, so that in the presence of misalignments and size tolerances, N+ doping used to form the source and drain would not extend off the edges of the gate into the gap regions, which could partially defeat the "pullback" of NSD 208 all along the left and right edges of the active region defined by ACTIVE 202. This technique to improve gate doping can be combined with the silicide block pattern in FIG. 4A that allows silicide formation all along the gate to further reduce gate resistance.

Figure 5A:
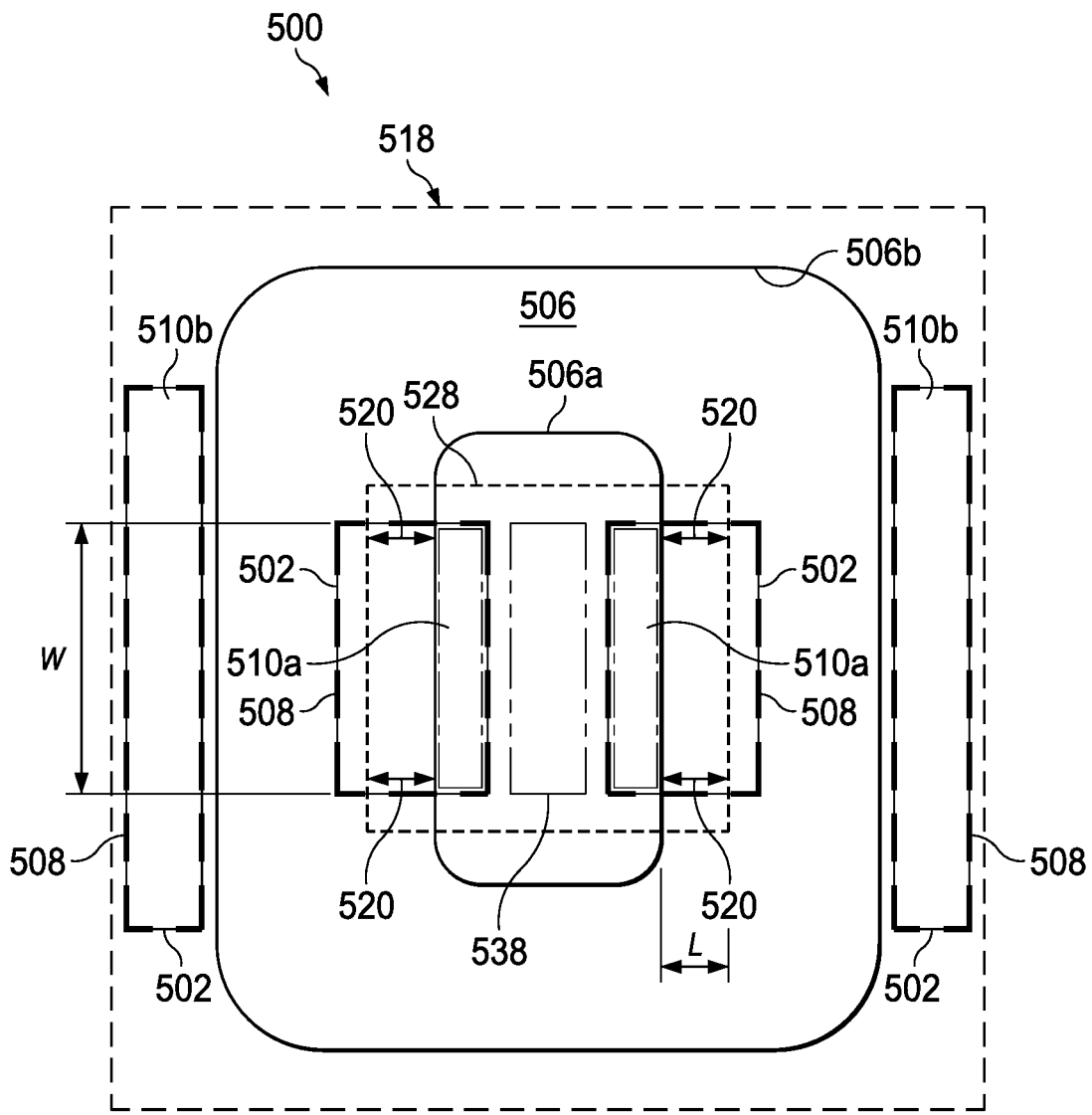
FIG. 5A is a schematic plan view or mask layout of a prior art annular gate high-voltage DENMOS transistor showing TID-induced leakage paths.

Embodiments in which the principles set forth herein are applied to Drain-Extended NMOS (DENMOS) devices are next described. Drain-Extended MOS (DEMOS) has a drain extension region to support higher breakdown voltages for power amplifier and similar applications, and the NMOS transistor in this technology is referred to as a DENMOS device. An example of a prior art high-voltage (50 V breakdown) DENMOS transistor 500 having an annular (ring-shaped) gate electrode 506 and a dual symmetrical design is shown in FIG. 5A. The inner edge of the gate 506 is indicated by reference numeral 506a and the outer edge by 506b. Active regions 502 and NSD (N+ source/drain implant) regions 508 are indicated by boundaries that are thick dashed, and thin continuous lines, respectively, as before. This device is fabricated in an n-well 518, and has two source regions 510a and two drain regions 510b. The source regions 510a consist of those areas that are not covered by the gate 506 (i.e. that are inside the "hole" in the gate) that are also inside the NSD 508 boundaries. (Alternatively, an annular N+ drain region 510b can completely encircle the gate within the n-well 518.) There is a p-well region 528 in the center of the device with a P+ body contact 538 (also called a back gate) in the center of the hole in the annular gate 506. The body contact 538 is typically connected electrically to the sources 510a either by silicide (not shown), and/or using contact metallization and dropping contacts to both the sources and the body contact. Four radiation-induced leakage paths 520 occur along the edges of active regions (STI trench insulator edges) between the inner edge 506a of the gate next to the source regions 510a and the boundary of the p-well 528 that defines the outer ends of the channel region of length L. The principles of the present invention can be applied to mitigate the leakage paths 520 and thereby increase the radiation hardness of this high-voltage DENMOS device.

Figure 5B:
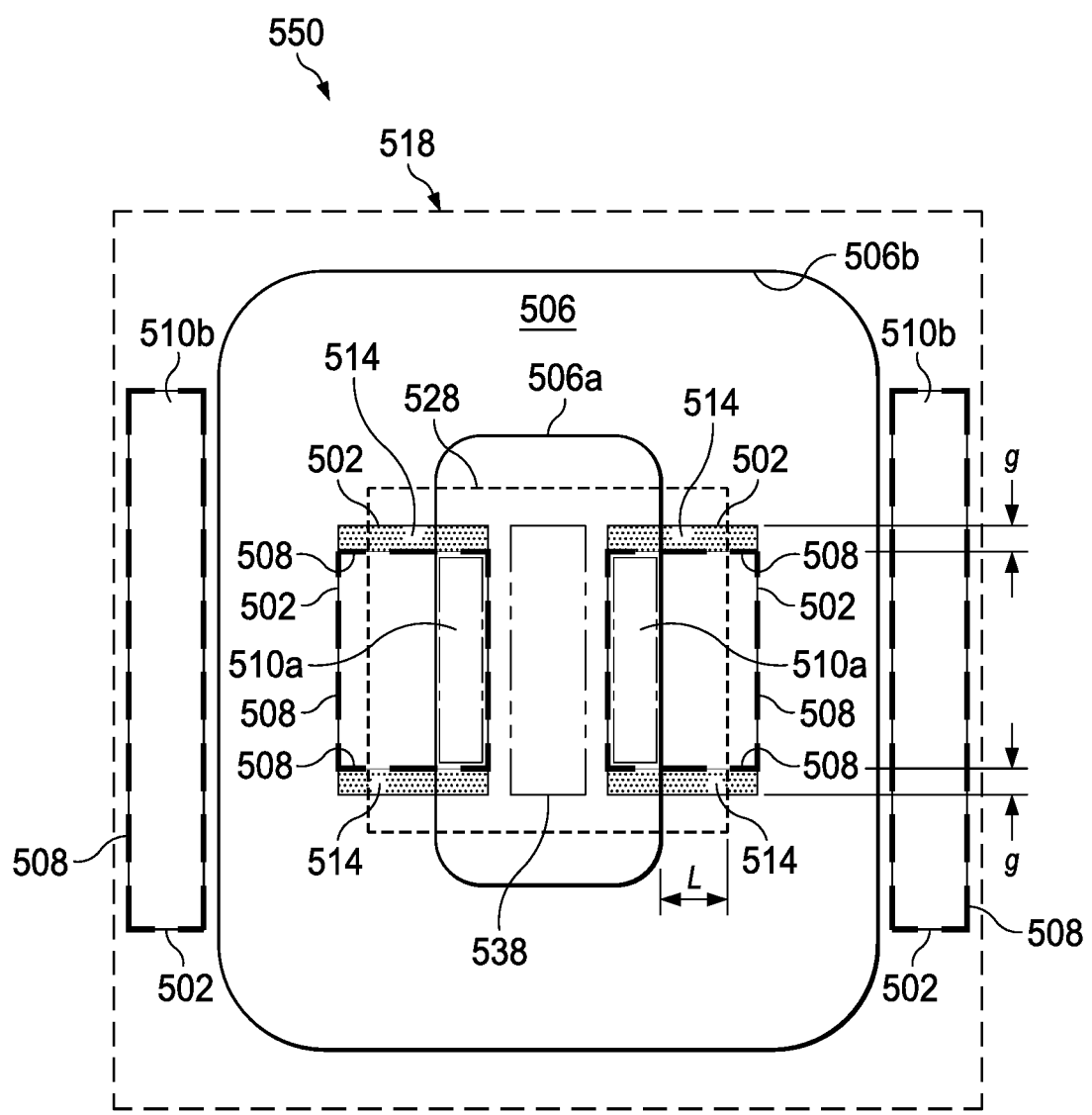
FIGS. 5B-5C are schematic plan views or mask layouts of annular gate high-voltage DENMOS transistors according to embodiments of the present invention.
Figure 5C:
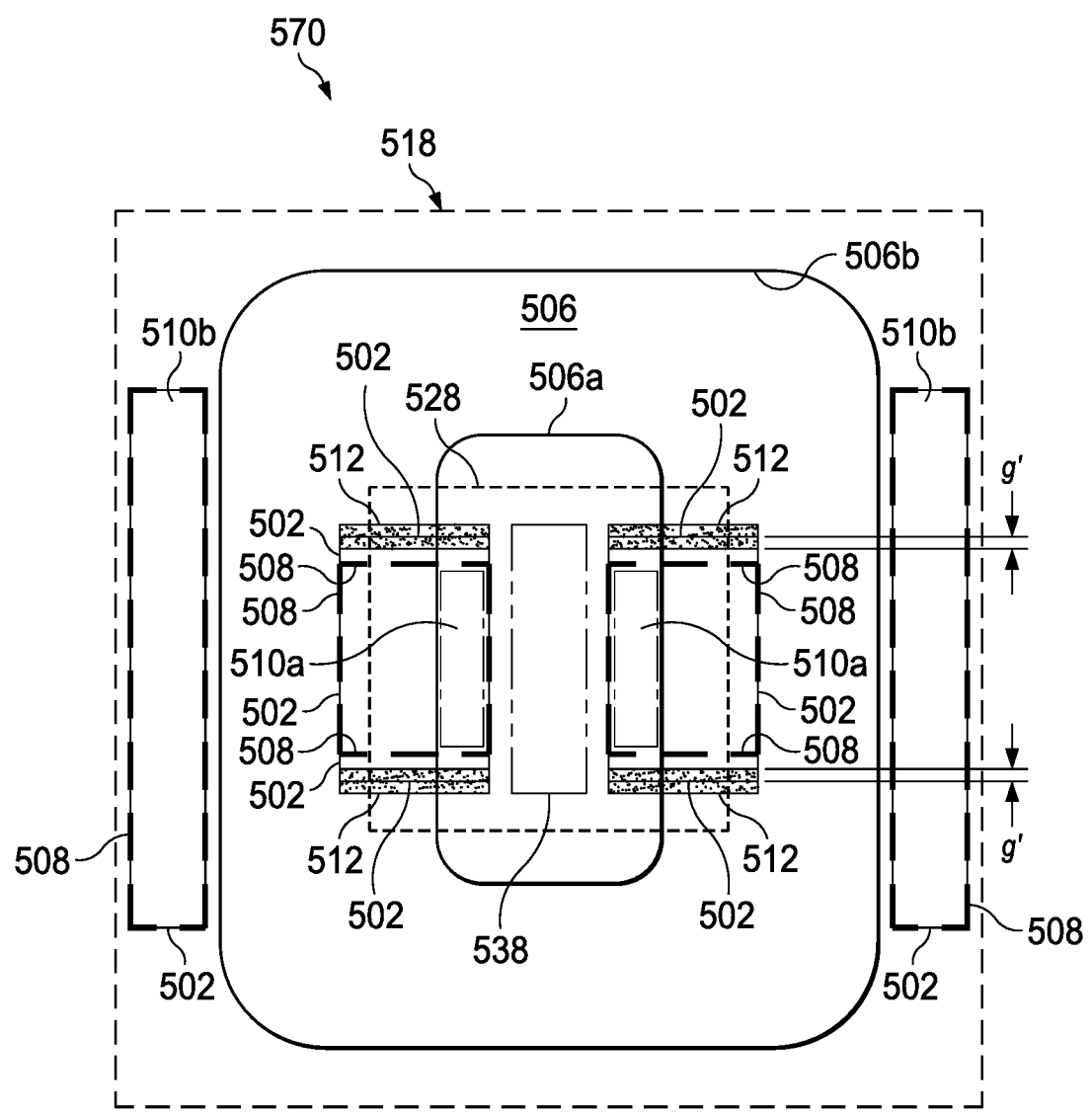

Application of the principles of the present invention to an annular-gate DENMOS device is demonstrated in FIGS. 5B and 5C. In FIG. 5B, an embodiment of an improved layout for a DENMOS transistor 550 is shown. It can be seen that the same pullback of NSD 508 from ACTIVE 502 can be employed to break the leakage path. The pullback into the active region is accomplished at the top and bottom edges of both sources 510a, by a gap distance gas before. A Silicide Block pattern 514 is placed (in 4 places in FIG. 5B) covering the gap regions as shown so as to prevent silicide formation in the gaps. In this simple layout, the silicide block SB pattern 514 consists of rectangles that run the full (left to right) extent of the upper and lower boundaries of the active region 502 where NSD 508 has been pulled back. In actuality, the only portions of the gap area where silicide needs to be removed are those that are not covered by gate 506, e.g. immediately above and below the shortened source regions 510a, since silicide does not form underneath the gate 506. But the layouts illustrated herein, using larger patterns, are simpler and less susceptible to misalignments.

Referring next to FIG. 5C, an embodiment of an annular-gate DENMOS transistor 570 utilizing an additional p-type band implant pattern 512 is shown. In FIG. 5C, the Silicide Block pattern is not shown, so that the NR 512 can be seen more clearly. In this embodiment, the p-type bands 512 are implemented along the top and bottom edges of the active region 502 associated with the sources and channel under gate 506, and extending into the gap region by an overlap distance g'. The p-type band is placed at least along the leakage path 520 as shown in FIG. 5A (but not shown in FIG. 5C). In practice, the p-type band patterns 512 can run the full width of the inner active regions as shown with no deleterious effect, and they would be used in conjunction with the NSD pullback as in FIG. 5B.

Figure 6:
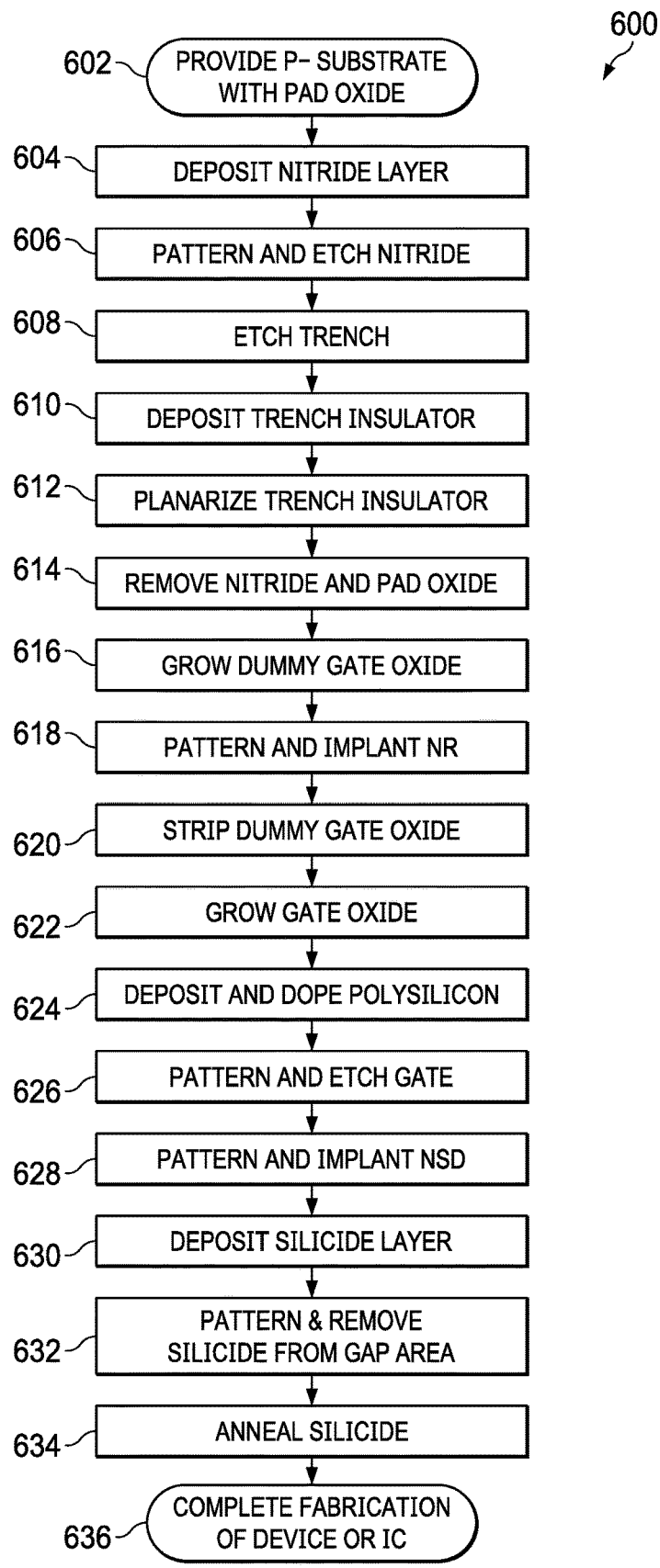
FIG. 6 is a flow chart depicting a method for fabricating a device or integrated circuit according to an embodiment of the present invention.

Referring now to FIG. 6, a flow chart is shown of a process 600 for fabricating integrated circuits having transistors according to the present invention. The process starts as in a standard STI process in start block 602, in which a substrate such as a silicon wafer having a P− epi layer and a pad (protective) oxide is provided on the top surface. The substrate is typically a low-doped p-type (P−) epitaxial layer (P− epi) on a highly-doped (P+) silicon wafer, but can be a P− silicon layer on an insulator (SOI), or a p-well in an n-type layer or region. Steps 604, depositing a nitride layer, and 606, patterning and etching the nitride, together comprise forming a masking layer on the top surface of the substrate to define one or more active regions. Steps 608, etching a trench in the substrate, 610 depositing a trench insulator such as silicon dioxide, and 612, planarizing the trench insulator, which is typically a chemical mechanical polishing step (CMP) to planarize the field oxide to create a level surface, are done to form a trench insulator in areas that are not covered by the (nitride) masking layer. Suitable depths for the trench that is etched in step 608 vary with the technology node and are known to those skilled in the art. Step 610 typically uses a plasma deposition process to deposit a silicon dioxide trench insulator. In step 614, the nitride and pad oxide are removed to expose the substrate surface in areas that will become active regions. Steps 616, 618, and 620 are optional steps used to form p-type bands in some embodiments of the invention, but similar steps and photomasks for them are typically part of most existing CMOS processes. Specifically, a dummy thin "gate oxide" is grown in step 616 to protect the active regions, and then the p-type bands are patterned and implanted in step 618. Useful implant parameters for forming p-type bands that are effective for increasing the radiation hardness of the device by increasing the threshold voltage of parasitic field edge transistors might be an implant energy of approximately 30 to 50 keV, and a dose of between $7 \times 10^{12}$ and $2 \times 10^{13}$ cm$^{-2}$ to achieve a threshold voltage of 10-12 V for the parasitic field edge transistors. This is a higher dose than the voltage threshold adjust implant using what may be known as the NR mask, but does not result in a P+ (high) doping, but rather a moderately-doped p-type band. The same NR mask may be designed so that it can be used for step 618, and thus step 618 is called "pattern and implant NR" in the flow chart of FIG. 6. As mentioned earlier, a tilted or "rotation implant" may be used to insert p-type ions into the sidewall and underneath the edges of the trench insulator at the edges of the active regions. After this NR implant, in step 620 the dummy gate oxide is stripped, and in step 622 a permanent gate oxide is grown. Then in step 624, polysilicon is deposited (and optionally but commonly doped), and the gates are patterned and etched in step 626, after which fully-formed gates (and related interconnects on the polysilicon level) are in place. The step of patterning and etching the gates in step 626 includes etching away the gate oxide from areas not covered by gate polysilicon, leaving bare silicon in the active regions away from the gates.

In step 628, the N+ source and drain regions are patterned using the NSD mask and implanted, using a pattern designed according to principles described with reference to the schematic plan views above, with the edge of the NSD pattern pulled back from the STI edges (ACTIVE pattern) in the amounts and directions discussed. In some embodiments, the gate can be further doped, and as in FIG. 4B, the N+ doping in the gate can be increased by an NSD pattern having tabs extending across the gate in the width direction.

Steps 630, 632, and 634 together exemplify a method for forming a conductive metal silicide layer on silicon or polysilicon areas where lower resistivity is desired, while excluding polysilicon (preventing its formation or removing it) from gap regions, which are active regions not implanted N+ using the pulled-back NSD pattern. If a direct silicide deposition process is available, a silicide layer may be deposited in step 630, followed in step 632 by patterning (using the proper polarity of the silicide block SB mask) and etching to remove the silicide layer from gap regions (gap area). In step 634, the silicide is annealed to convert it to the desired composition and phase.

In many CMOS processes offering a silicide, steps 630 through 634 may be accomplished in a different manner. In a common method, silicide is formed by first depositing a protective layer such as an oxide and patterning the protective layer using the silicide block SB mask to leave areas where silicide is not wanted covered by the protective layer. Then a metal is deposited that will react with silicon and polysilicon to form a metal silicide. These steps are like performing the first part of step 632 and then step 630. A silicidation anneal is performed (as in step 634) to react the metal to form silicide in the unprotected areas (where silicon is exposed to the metal); silicide does not form on the protective layer where there is no silicon exposed. Then the protective layer and unreacted metal on it are removed (as in the second part of step 632), leaving reacted metal silicide in the areas where it is wanted, and not in areas where it is to be excluded such as the gap regions. An additional anneal may be used with some metal silicides to convert them to the proper conductive phase.

After the metal silicide has been formed and patterned to exclude it from the gap regions, all other remaining steps in device fabrication or the entire IC are performed in final step 636.

Figure 7A:
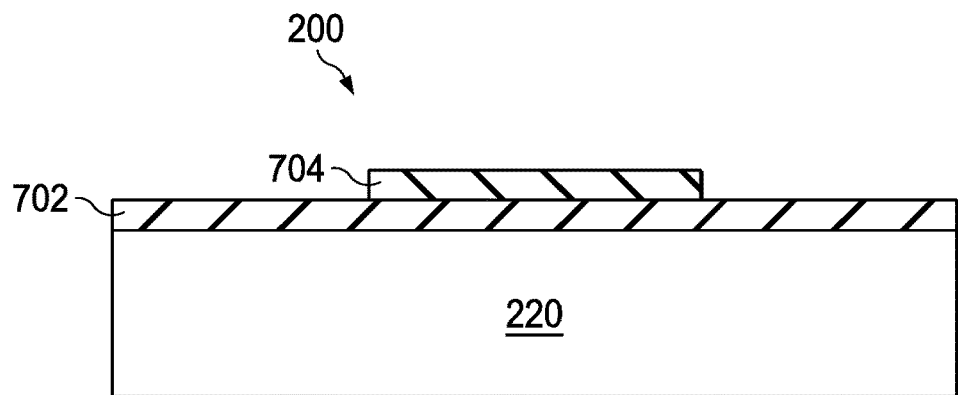
FIGS. 7A-7L are schematic cross-sections of an NMOS transistor at various stages in a fabrication process according to an embodiment of the present invention.
Figure 7B:
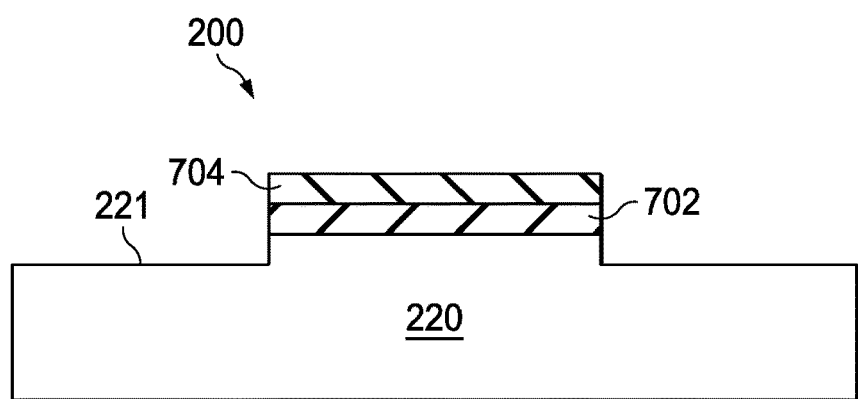
Figure 7C:
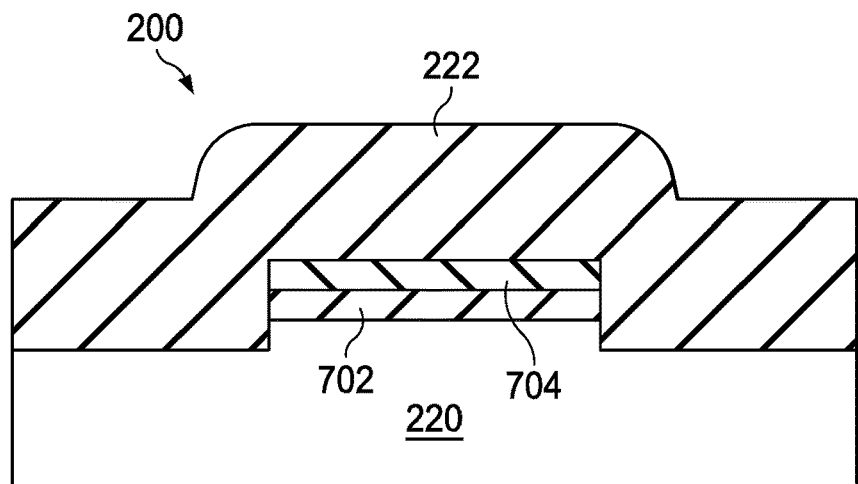
Figure 7D:
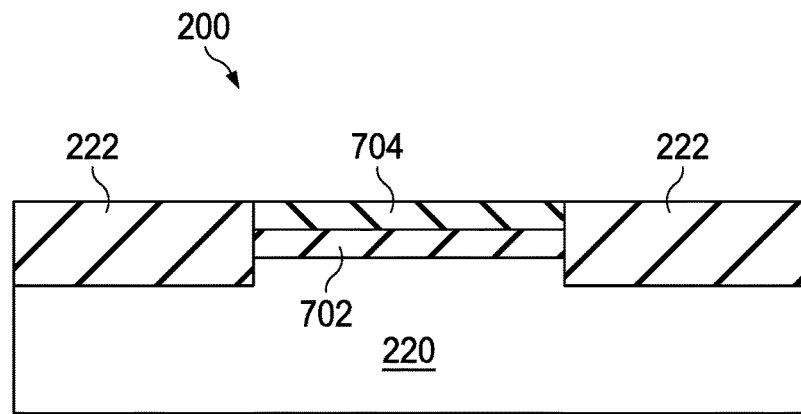
Figure 7E:
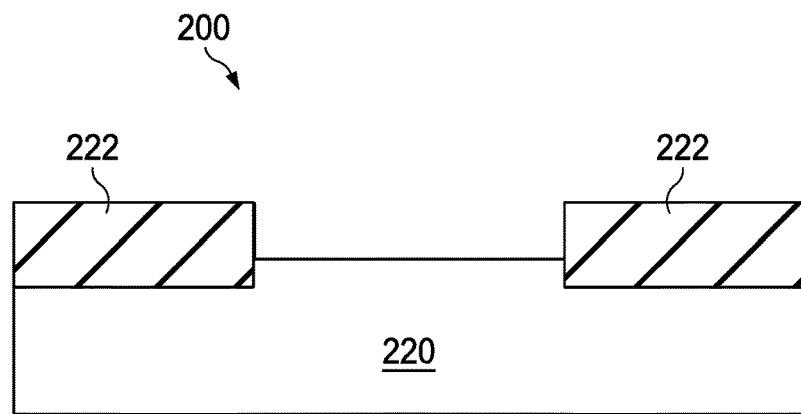
Figure 7F:
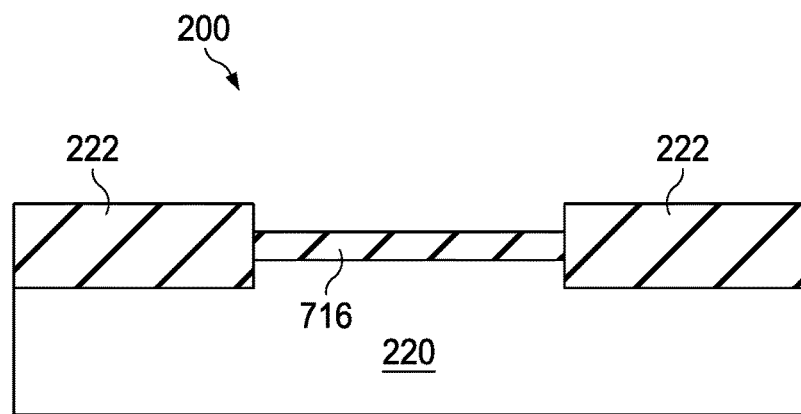
Figure 7G:
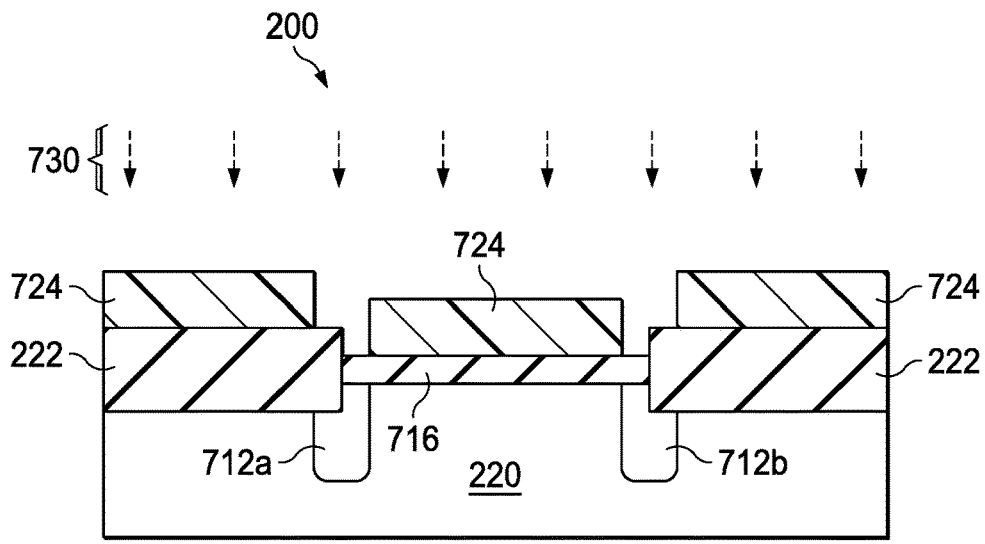
Figure 7H:
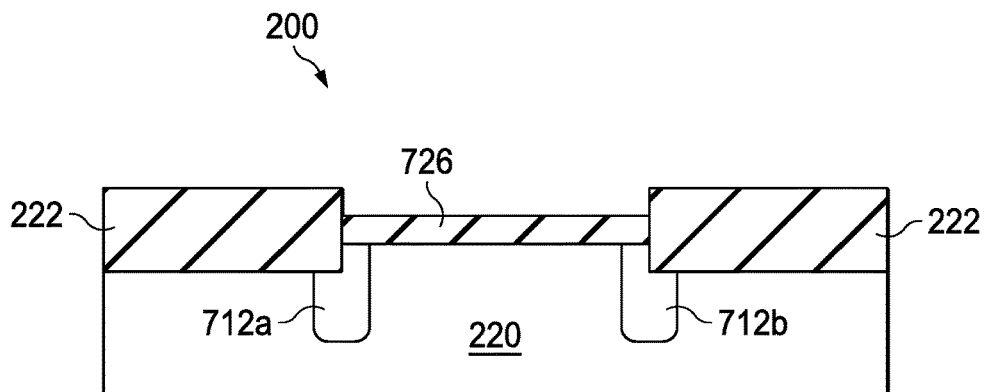
Figure 7I:
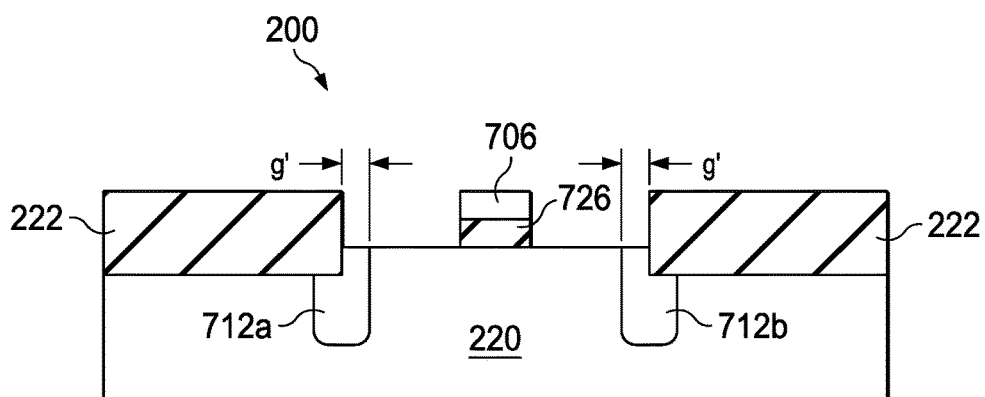
Figure 7J:
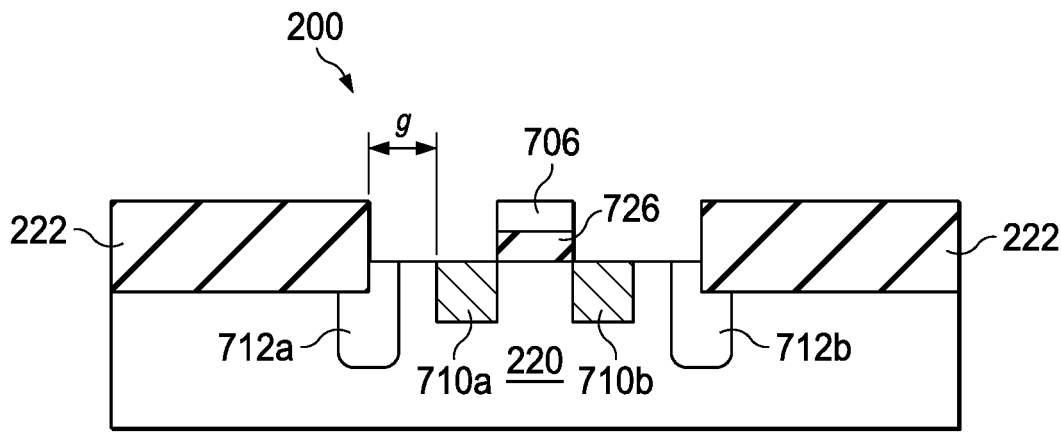
Figure 7K:
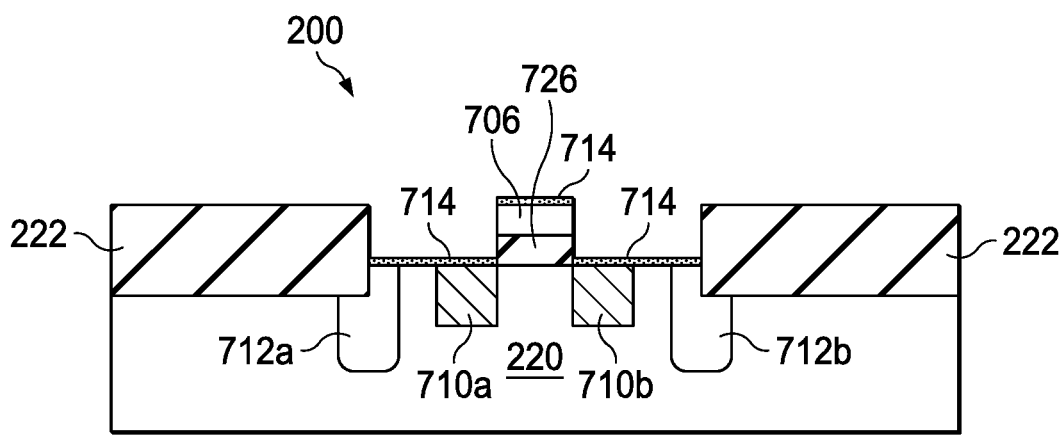
Figure 7L:
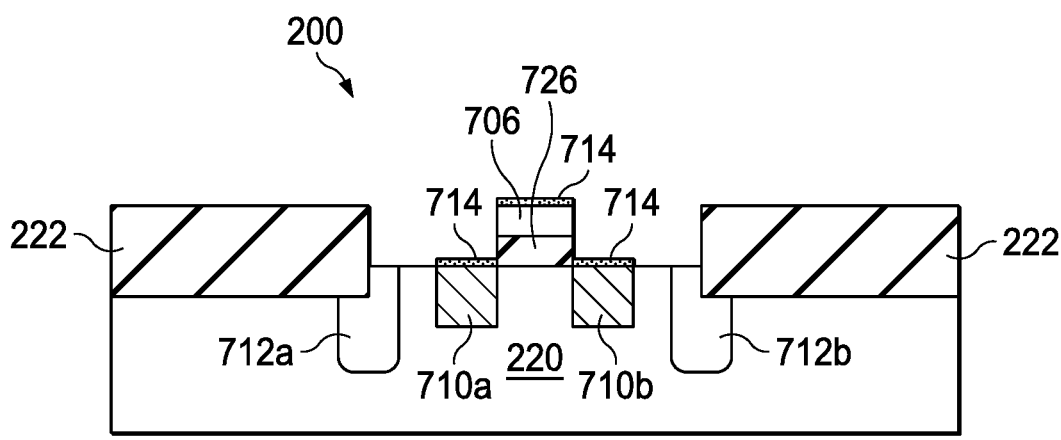

Referring now to FIGS. 7A-7L, schematic cross-sections showing a device 200 (transistor or IC) at various stages during the fabrication process 600 shown in the flow chart of FIG. 6 are depicted. FIG. 7A shows the device after step 606, i.e. after the masking layer 704 (silicon nitride on top of a substrate 220 with a pad oxide layer 702) has been etched that will define the active regions. FIG. 7B is a cross-section after step 608, in which a trench 221 has been etched for the trench isolation process. FIG. 7C is shown after step 610, deposition of the trench insulator 222 to cover trenches and active regions (covered by pad oxide and masking layer) with trench insulator material. FIG. 7D is shown after step 612, planarization, which levels the surface of the trench insulator 222 with the top of the masking layer 704. FIG. 7E shows the device after step 614, after the nitride and pad oxide have been removed over the active regions. FIG. 7F is shown after step 616; the pad oxide has been removed and replaced with a thin dummy gate oxide 716 to protect the surface while allowing implantation of p-type dopant such as boron for the p-type band implant. The p-type band (NR) implant (step 618) is shown in progress in FIG. 7G, with a photoresist implant mask 724 shown patterned and in contact with the wafer. Boron ions 730 are implanted through NR photoresist 724 to form p-type bands 712a and 712b. The photoresist is then removed, dummy gate oxide stripped, and final gate oxide 726 grown as shown in FIG. 7H. is a snapshot after step 622; the dummy gate oxide has been removed in 620 and real gate oxide grown in step 622. After polysilicon has been deposited and doped in step 624, and patterned and etched in step 626, the device appears schematically as in the cross-section of FIG. 7I, which shows the deposited, patterned, and etched gate 706 on top of a self-aligned gate oxide 726. FIG. 7I also shows the overlap g' of the p-type bands 712a and 712b into the active region. FIG. 7J shows the device after patterning and implanting NSD to form source/drain regions 710a and 710b; the "pullback" of the N+ implants by gap g from the field oxide 222 edges and NR implants 712a and 712b is clearly seen. FIG. 7K shows the device after silicide 714 has been deposited in step 630 onto silicon active regions and polysilicon gate 706 (silicide is not shown over field oxide 222), FIG. 7L shows the device after the step 632 including patterning and removing the silicide from the gap area (gap region). The appearance of the schematic cross-section is unchanged after the annealing step 634. The device is now ready for completion using conventional processes.

Figure 8:
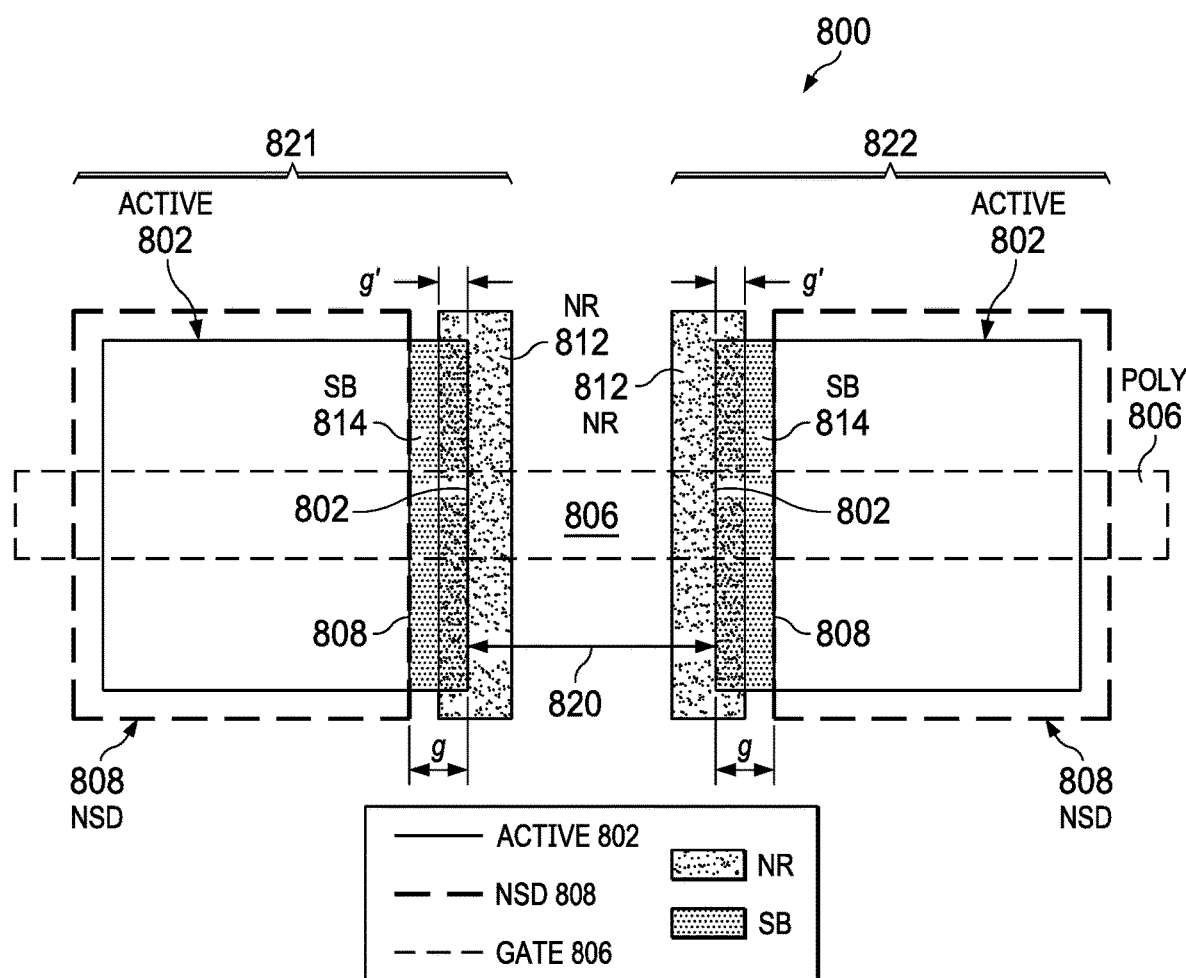
FIG. 8 is a schematic plan view or mask layout showing neighboring NMOS transistors in a portion of an integrated circuit produced according to another embodiment of the present invention.

Besides leakage paths within transistors, in certain embodiments, the principles of the present invention can also be used to mitigate or eliminate certain leakage paths between neighboring transistor devices or other circuit elements. Referring now to FIG. 8, device structures to shut off a radiation-induced leakage path between two neighboring transistor devices 821 and 822 in a portion of an integrated circuit 800 are shown. In this case, when the interconnect is energized, a parasitic transistor under the gate-level polysilicon interconnect 806 between the two transistors can cause current to flow, with the direction of a leakage path 820 indicated by the double-headed arrow. The actual leakage path is formed under the gate level interconnect 806 between the two transistors 821 and 822, but the arrow is shifted downward for clarity. The direction of current along the leakage path under the gate level interconnect depends on the relative potentials of the neighboring devices. This leakage path can be effectively blocked by using the NSD pullback technique as indicated in FIG. 8 and described in detail earlier. The boundaries of active regions 802 and NSD 808 are seen in both transistors, and it can be seen that in each transistor, the NSD pattern 808 has been pulled back by gap g away from the edge of active region 802 nearest the neighboring transistor. The pulled-back gap region is "filled" with silicide block pattern SB 814 in both transistors, preventing a conductive connection from sources or drains to the p-type substrate. Optional p-type bands 812 formed using the NR pattern as described previously can be used to further raise the turn-on voltage of the parasitic transistors and block leakage at the edges of the active regions. The same variations of SB pattern shapes, and the lengths and overlaps g' of the p-type bands as were used within an NMOS transistor apply to this interconnect situation. These techniques can be used in an integrated circuit to block leakage currents along gate-level interconnects not only between neighboring NMOS transistors, but that can occur between an NMOS transistor and a neighboring n-well.

According to embodiments of the present invention, radiation-hardened NMOS transistor devices in a Shallow Trench Isolation (STI) process are provided that have low TID radiation-induced leakage currents. The transistor devices of the present invention are suitable for application individually, or within NMOS, CMOS, BiCMOS, and/or LDMOS integrated circuits, for operation in high-radiation environments. The transistor devices provided by this invention may also be used in other applications requiring low leakage and high breakdown voltage. The present invention also provides integrated circuit (IC) devices fabricated using an STI process, that contain these improved radiation hardened transistor devices, and/or features to reduce radiation-induced leakage currents between neighboring devices. The Hardness-By-Design concepts presented herein can be applied to commercial IC processes and technologies that are not inherently radiation-hard, and the invention provides radiation hardened devices and circuits exhibiting lower Total Ionizing Dose radiation-induced leakage currents while maintaining high breakdown voltages and a minimal change in circuit density. According to yet other embodiments of the present invention, methods for fabricating radiation hardened MOS devices using Shallow Trench Isolation (STI) are provided that accommodate the improved design and layout techniques also provided herein.

It will be appreciated that the present inventive designs and methods of fabricating radiation hardened MOS devices, which have originally been applied to NMOS or DENMOS devices within a CMOS, LDMOS or BiCMOS integrated circuit, is also applicable to fabricating other types of integrated circuits containing other devices further including, for example, PMOS devices, bipolar junction transistors, diodes, p-n-p-n devices, resistors, and capacitors. It should also be appreciated that such an integrated circuit is representative of only one suitable environment for use of the invention, and that the invention may be used in a multiple of other environments in the alternative. The invention should therefore not be limited to the particular implementations discussed herein.

Other applications of these techniques will also be apparent, and therefore the scope of the invention is much broader than the few specific examples described herein. While the present invention has been particularly shown and described in detail with reference to the preferred embodiments thereof, it will be understood by those skilled in the art that various modifications can be made in form and details therein without departing from the spirit and scope of the invention as set forth in the appended claims.

I claim:

1. A method of fabricating a radiation-hardened NMOS device using a shallow trench isolation process, comprising the steps of:
    (a) providing a silicon substrate having a top surface, a P− layer extending from said top surface into the substrate, and a pad oxide layer on said top surface;
    (b) forming a masking layer on said top surface, wherein said forming step comprises depositing, patterning, and etching the masking layer to define at least one active region covered by said masking layer;
    (c) etching a trench in the substrate in an area not covered by said masking layer to define an area to be filled with a trench insulator material;
    (d) depositing a trench insulator material over the substrate;
    (e) planarizing the trench insulator material so that a top surface of said trench insulator is substantially coplanar with a top surface of the masking layer;
    (f) removing the masking layer and pad oxide from said at least one active region;
    (g) growing a gate oxide in the at least one active region;
    (h) depositing a polysilicon gate layer;
    (i) patterning and etching the polysilicon gate layer to form a gate crossing the active region in a width direction and having a length L in a length direction, said gate defining a channel having the same length L, wherein said patterning and etching further comprises removing the gate oxide from the active region not covered by the gate, thereby exposing the top surface of the substrate where the gate oxide has been removed;

(j) patterning and implanting n-type source and drain regions with N+ doping, using a mask pattern wherein at least one segment of a border of the mask pattern that defines an n-type region comprising one or both of said source and drain regions is pulled back a nonzero distance into the active region, said pulled-back segment of the border defining a gap region comprising an area of the active region outside the n-type region that is contiguous with both the pulled-back segment of the border of the n-type region and the edge of the trench insulator;

(k) forming a metal silicide layer on the exposed top surface of the substrate where the gate oxide has been removed while preventing the metal silicide layer from forming in the gap region; and (l) completing fabrication of the radiation-hardened NMOS device.

2. The method of fabricating a radiation-hardened NMOS device of claim 1, further comprising the steps of:

growing a dummy gate oxide;

patterning and implanting a moderately-doped p-type band along the edge of the trench insulator, said p-type band positioned in the length direction under the gate where the gate crosses the edge of the trench insulator and extending at least along the entire length L of the channel; and stripping the dummy gate oxide.

3. The method of fabricating a radiation-hardened NMOS device of claim 1, wherein the step of forming a metal silicide layer comprises:

depositing a protective layer;

patterning and etching said protective layer to selectively remove the protective layer from silicon areas where metal silicide is to remain and to leave the protective layer over the gap region;

depositing a layer of silicide-forming metal;

performing an anneal to cause a metal silicide to form on silicon areas outside the gap region, while silicidation is prevented in the gap region and in other areas covered by the protective layer; and removing the protective layer.

* * * * *

UNITED STATES PATENT AND TRADEMARK OFFICE
CERTIFICATE OF CORRECTION

| | |
|---|---|
| PATENT NO. | : 10,950,489 B2 |
| APPLICATION NO. | : 16/937881 |
| DATED | : March 16, 2021 |
| INVENTOR(S) | : Emily Ann Donnelly |

It is certified that error appears in the above-identified patent and that said Letters Patent is hereby corrected as shown below:

In the Specification

Column 14, Line 8, please change "polysilicon" to --silicide--

Column 14, Line 38, please change "or" to --of--

Signed and Sealed this
Twenty-eighth Day of March, 2023

*Katherine Kelly Vidal*

Katherine Kelly Vidal
*Director of the United States Patent and Trademark Office*